(12) United States Patent
Choi et al.

(10) Patent No.: US 10,983,388 B2
(45) Date of Patent: Apr. 20, 2021

(54) DISPLAY DEVICE

(71) Applicant: LG Display Co., Ltd., Seoul (KR)

(72) Inventors: Eunhee Choi, Goyang-si (KR); SeMin Lee, Seoul (KR); GiBin Kim, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 6 days.

(21) Appl. No.: 15/916,065

(22) Filed: Mar. 8, 2018

(65) Prior Publication Data

US 2018/0267358 A1    Sep. 20, 2018

(30) Foreign Application Priority Data

Mar. 15, 2017 (KR) .................. 10-2017-0032667
Dec. 29, 2017 (KR) .................. 10-2017-0184065

(51) Int. Cl.
| | |
|---|---|
| *H01L 27/32* | (2006.01) |
| *G02F 1/1335* | (2006.01) |
| *G02F 1/1368* | (2006.01) |
| *H01L 27/12* | (2006.01) |
| *G02F 1/1362* | (2006.01) |
| *H01L 51/52* | (2006.01) |

(52) U.S. Cl.
CPC ...... *G02F 1/133528* (2013.01); *G02F 1/1368* (2013.01); *G02F 1/133504* (2013.01); *G02F 1/133512* (2013.01); *G02F 1/133514* (2013.01); *G02F 1/136286* (2013.01); *H01L 27/124* (2013.01); *H01L 27/3276* (2013.01); *H01L 51/5275* (2013.01); *H01L 27/3211* (2013.01)

(58) Field of Classification Search
CPC . H01L 27/32–3297; H01L 51/50–5296; H01L 51/5275; G02F 1/133–1368; G02F 1/133526
See application file for complete search history.

(56) References Cited

U.S. PATENT DOCUMENTS

| | | | |
|---|---|---|---|
| 5,745,199 A * | 4/1998 | Suzuki ............. | G02F 1/133526 349/57 |
| 9,857,621 B1 * | 1/2018 | Gu .................... | G02F 1/133526 |
| 2002/0039157 A1 * | 4/2002 | Nakanishi ........... | G02B 3/0031 349/95 |
| 2002/0093607 A1 | 7/2002 | Van De Ven et al. | |
| 2005/0243551 A1 * | 11/2005 | Onishi ............. | G02F 1/133611 362/244 |

(Continued)

FOREIGN PATENT DOCUMENTS

| | | |
|---|---|---|
| CN | 101158778 A | 4/2008 |
| CN | 103885106 A | 6/2014 |

(Continued)

*Primary Examiner* — Eric A. Ward
(74) *Attorney, Agent, or Firm* — Seed IP Law Group LLP

(57) ABSTRACT

Disclosed is a display device capable of preventing a problem related with a bluish image at a lateral viewing angle by the use of optical-path adjustment film on an upper surface of a display panel, wherein the display device may include a display panel, and an optical-path adjustment film on the display panel, wherein the optical-path adjustment film includes a plurality of dome patterns, and a cover layer on the plurality of dome patterns, wherein a refractive index of the plurality of dome patterns is different from a refractive index of the cover layer.

13 Claims, 21 Drawing Sheets

(56) References Cited

U.S. PATENT DOCUMENTS

| | | | |
|---|---|---|---|
| 2007/0153377 A1* | 7/2007 | Goto | G02F 1/133524 359/460 |
| 2007/0257871 A1* | 11/2007 | Watanabe | G02F 1/133555 345/84 |
| 2008/0130316 A1 | 6/2008 | Kinoshita et al. | |
| 2012/0175648 A1* | 7/2012 | Kasano | H01L 51/5275 257/88 |
| 2012/0223873 A1* | 9/2012 | Ohta | H01L 27/3211 345/76 |
| 2012/0268042 A1* | 10/2012 | Shiobara | H01L 51/5275 315/312 |
| 2014/0036373 A1* | 2/2014 | Sunagawa | G02B 3/0012 359/620 |
| 2014/0175404 A1 | 6/2014 | Shim et al. | |
| 2014/0252330 A1* | 9/2014 | Oh | H01L 51/5275 257/40 |
| 2014/0252331 A1* | 9/2014 | Oh | G02B 5/0242 257/40 |
| 2015/0002790 A1* | 1/2015 | Ito | G02F 1/133526 349/95 |
| 2015/0043221 A1* | 2/2015 | Lee | G02B 5/0236 362/311.03 |
| 2015/0048333 A1 | 2/2015 | Choi et al. | |
| 2015/0103338 A1* | 4/2015 | Kim | H01L 51/5275 356/237.1 |
| 2015/0355502 A1* | 12/2015 | Ozawa | G02F 1/133526 349/57 |
| 2016/0013449 A1* | 1/2016 | Cui | H01L 51/5275 257/40 |
| 2016/0178810 A1* | 6/2016 | Chung | G02B 3/005 349/57 |
| 2016/0187682 A1 | 6/2016 | Oh et al. | |
| 2016/0252665 A1 | 9/2016 | Lee et al. | |
| 2018/0143490 A1* | 5/2018 | Wakabayashi | G02B 3/0037 |

FOREIGN PATENT DOCUMENTS

| | | |
|---|---|---|
| CN | 103913886 A | 7/2014 |
| CN | 104345361 A | 2/2015 |
| CN | 105261711 A | 1/2016 |
| CN | 105739164 A | 7/2016 |
| CN | 105929476 A | 9/2016 |
| KR | 2002-0079834 A | 10/2002 |
| KR | 10-0912361 B1 | 8/2009 |
| KR | 10-1255626 B1 | 4/2013 |
| KR | 10-1447216 B1 | 10/2014 |
| KR | 10-2015-0019325 A | 2/2015 |

* cited by examiner

| A RATIO OF HEIGHT (H) / TO DIAMETER (D) | 0 | 0.5 | 0.1 | 0.15 |
|---|---|---|---|---|
| IMAGE |  |  |  |  |
| A RATIO OF HEIGHT (H) / TO DIAMETER (D) | 0.2 | 0.3 | 0.4 | 0.5 |
| IMAGE |  |  |  |  |

FIG. 28B

| PITCH(μm)<br>( PATTERN FILL<br>FACTOR % ) | 4 (80%) | 4.3 (70%) | 4.6 (60%) | 5 (50%) |
|---|---|---|---|---|
| IMAGE | | | | |
| PITCH(μm)<br>( PATTERN FILL<br>FACTOR % ) | 6 (35%) | 8 (20%) | 10 (13%) | 12 (9%) |
| IMAGE | | | | |

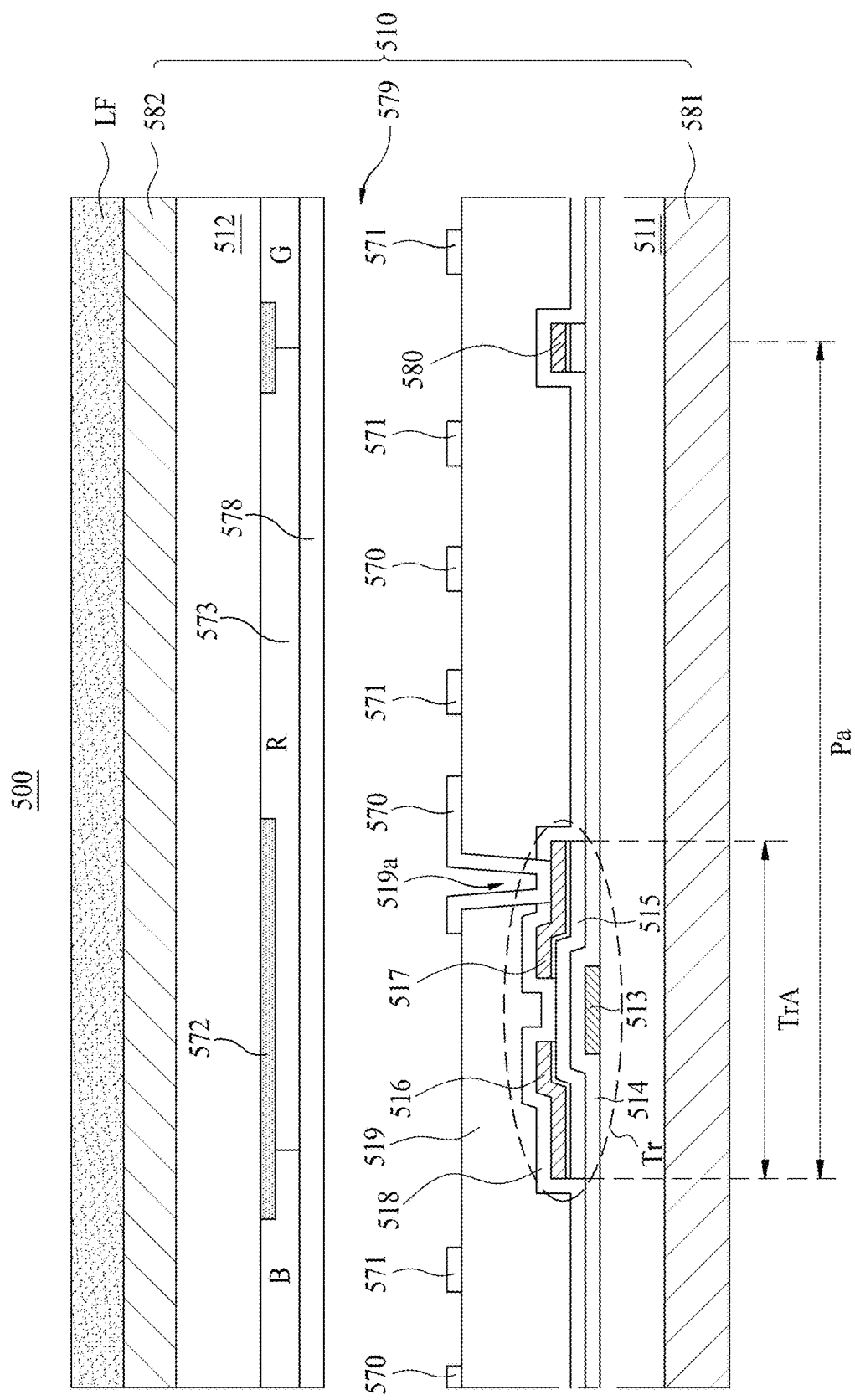

DISPLAY DEVICE

CROSS REFERENCE TO RELATED APPLICATIONS

This application claims the benefit of the Korean Patent Application No. 10-2017-0032667 filed on Mar. 15, 2017, and the Korean Patent Application No. 10-2017-0184065 filed on Dec. 29, 2017, which are hereby incorporated by reference as if fully set forth herein.

BACKGROUND

Technical Field

Embodiments of the present disclosure relate to a display device, and more particularly, to a display device with an optical-path adjustment film on an upper surface of a display panel.

Description of the Related Art

Display devices such as a liquid crystal display (LCD) device and an electroluminescent display device have various advantage of high resolution realization and large sized screen.

The display device includes a display panel for displaying an image. The display panel is provided with a plurality of pixels, wherein each of the plurality of pixels includes an individual sub-pixel for expressing an individual color. For example, each one pixel may include red, green, and blue sub-pixels.

In case of the related art, however, at a lateral viewing angle, an amount of light emitted from the display panel is changed by each wavelength range, which might cause deterioration of picture quality. For example, in case of the electroluminescent display device, each sub pixel emits individual color light. When the light emitted from each sub pixel is advanced toward an upper side of a display panel, an amount of light emitted by each wavelength range is changed at a lateral viewing angle, which causes deterioration of picture quality. Especially, at a lateral viewing angle, an emission amount of light with a short wavelength, for example, blue color light is relatively increased in comparison to an emission amount of light with a long wavelength, for example, red color light, which causes a problem related with a bluish image.

BRIEF SUMMARY

Accordingly, embodiments of the present disclosure are directed to a display device that substantially obviates one or more problems due to limitations and disadvantages of the related art.

An aspect of embodiments of the present disclosure is directed to provide a display device which is capable of preventing a problem related with a bluish image at a lateral viewing angle by the use of optical-path adjustment film on an upper surface of a display panel.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided a display device that may include a display panel; and an optical-path adjustment film on the display panel, wherein the optical-path adjustment film includes a plurality of dome patterns, and a cover layer on the plurality of dome patterns, wherein a refractive index of the plurality of dome patterns is different from a refractive index of the cover layer.

In another aspect of the embodiments of the present disclosure, there is provided a display device that may include a display panel having a pixel with a plurality of sub pixels; an optical-path adjustment film having a first refractive index, wherein the optical-path adjustment film is disposed on the display panel; and an optical adhesive film disposed between the display panel and the optical-path adjustment film, wherein the optical-path adjustment film includes a base film, and a plurality of dome patterns on an upper surface of the base film.

In another aspect of the embodiments of the present disclosure, there is provided a display device that may include a display panel having a pixel with a plurality of sub pixels; an optical-path adjustment film disposed on the display panel, wherein the optical-path adjustment film has a third refractive index, and includes a plurality of intaglio dome patterns in its lower surface; and an optical adhesive film disposed between the display panel and the optical-path adjustment film, wherein the optical adhesive film for covering the plurality of intaglio dome patterns has a fourth refractive index which is larger than the third refractive index.

It is to be understood that both the foregoing general description and the following detailed description of embodiments of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings:

FIG. 28B is a photograph showing the change of lattice pattern in accordance with the change of pattern fill factor;

FIG. 31 illustrates one example of the display device according to the embodiment of the present disclosure, which includes a liquid crystal panel.

DETAILED DESCRIPTION

Figure 1:
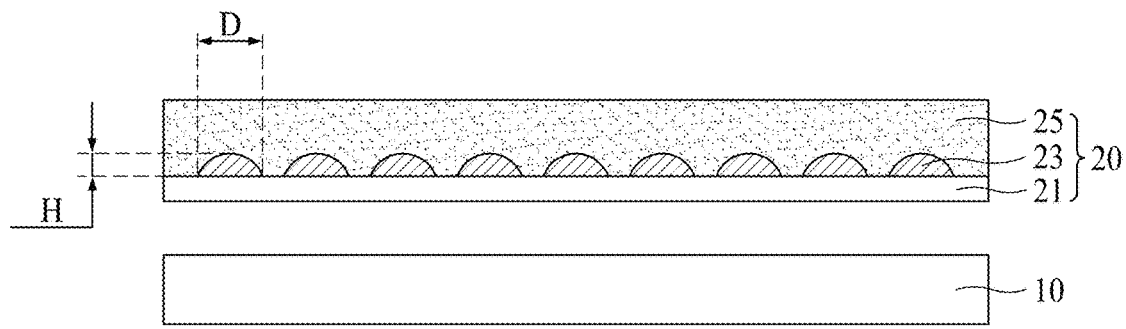
FIG. 1 illustrates a display device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~' and 'next~', a case which is not contact may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display device according to the embodiment of the present disclosure will be described in detail with reference to the accompanying drawings.

FIG. 1 illustrates a display device according to one embodiment of the present disclosure.

As shown in FIG. 1, the display device according to one embodiment of the present disclosure may include a display panel 10, and transparent optical-path adjustment film 20.

The display panel 10 may be formed of an electroluminescent display panel generally known to those in the art, but not limited to this type. If the display panel 10 is formed of the electroluminescent display panel, the electroluminescent display panel is a top emission type in which light emitted from an emission layer advances upwardly.

The optical-path adjustment film 20 is provided on an upper surface of the display panel 10. The optical-path adjustment film 20 includes a base layer 21, a plurality of dome patterns 23, and a cover layer 25.

The base layer 21 is formed of a transparent material, wherein lower and upper surfaces of the base layer 21 are flattened.

The plurality of dome patterns 23 may be provided on an upper surface of the base layer 21, wherein each of the plurality of dome patterns 23 may be formed in a convex pattern. The plurality of dome patterns 23 may be disposed at fixed intervals, but not limited to this structure. The plurality of dome patterns 23 may be in contact with each other.

An upper surface in each of the plurality of dome patterns 23 may have a curved-line shaped cross section structure such as an arch-shaped structure, wherein the cross section structure of the upper surface in the plurality of dome patterns 23 may be the same. In this case, a ratio of height (H) to diameter (D) in each of the plurality of dome patterns 23 may be within a range of 0.05 to 2. If the ratio of height (H) to diameter (D) is not within the above range, it is difficult to obtain effects on changing an optical path by each wavelength range according to FIGS. 2A and 2B.

The plurality of dome patterns 23 may be obtained by coating a predetermined material layer onto the base layer 21, and pressing the predetermined material layer by the use of stamper. In this case, the stamper may have a concave pattern corresponding to the plurality of dome patterns 23, but not limited to this type. The base layer 21 and the plurality of dome patterns 23 may be formed as one body, and the base layer 21 and the plurality of dome patterns 23 may be formed of the same material. Alternately. The dome patterns might be formed of a different material from the base layer 21. Thus, the different cross-hatch pattern for the dome layer in FIG. 1 indicates the shape of the dome and does not necessarily indicate it is made of a different material from layer 21.

The cover layer 25 is formed on the upper surface of the plurality of dome patterns 23. A lower surface of the cover layer 25 is in contact with the upper surface of the plurality of dome patterns 23, and is in contact with the upper surface of the base layer 21 on which the plurality of dome patterns 23 are not provided. The upper surface of the cover layer 25 may be flattened.

A material for the cover layer 25 may be different from the material for the plurality of dome patterns 23. A refractive index of the material for the cover layer 25 may be higher or lower than that of the material for the plurality of dome patterns 23.

The optical-path adjustment film 20 including the base layer 21, the plurality of dome patterns 23 and the cover layer 25 may be attached onto the upper surface of the display panel 10 by the use of adhesive layer, but not limited to this structure.

However, it is possible to fix the optical-path adjustment film 20 onto the upper surface of the display panel 10 without using an additional adhesive layer. In this case, the base layer 21 may be directly coated onto the upper surface of the display panel 10, and then the plurality of dome patterns 23 and the cover layer 25 may be sequentially formed thereon. Selectively, the base layer 21 and the plurality of dome patterns 23 may be formed at the same time on the upper surface of the display panel 10, and then the cover layer 25 may be formed thereon. If needed, the plurality of dome patterns 23 may be directly formed on the upper surface of the display panel 10 without additional adhesive layer, and then the cover layer 25 may be formed thereon. That is, it is possible to provide the optical-path adjustment film 20 without the base layer 21. If the display panel 10 is formed of the electroluminescent display panel, the optical-path adjustment film 20 may be directly formed on an encapsulation layer of the display panel 10 without additional adhesive layer.

According to one embodiment of the present disclosure, light, which is emitted from the display panel 10 and is then incident on the optical-path adjustment film 20, is firstly refracted on the interface between the cover layer 25 and the plurality of dome patterns 23, secondly refracted on the upper surface of the cover layer 25. In this case, it is possible to adjust a refractive index of the light emitted by each wavelength range, that is, it is possible to overcome a problem related with a bluish image at a lateral viewing angle, which will be described with reference to FIGS. 2A and 2B.

Figure 2A:
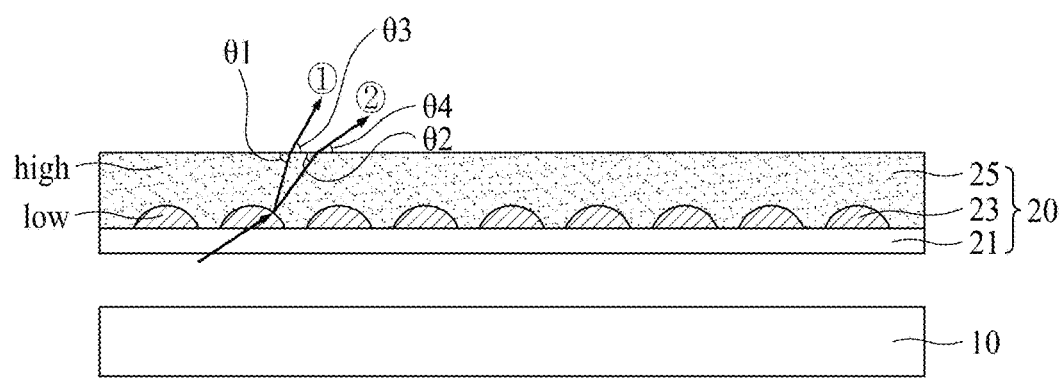
FIGS. 2A and 2B illustrate that an optical path is adjusted by each wavelength range in the display device according to one embodiment of the present disclosure shown in FIG. 1.
Figure 2B:
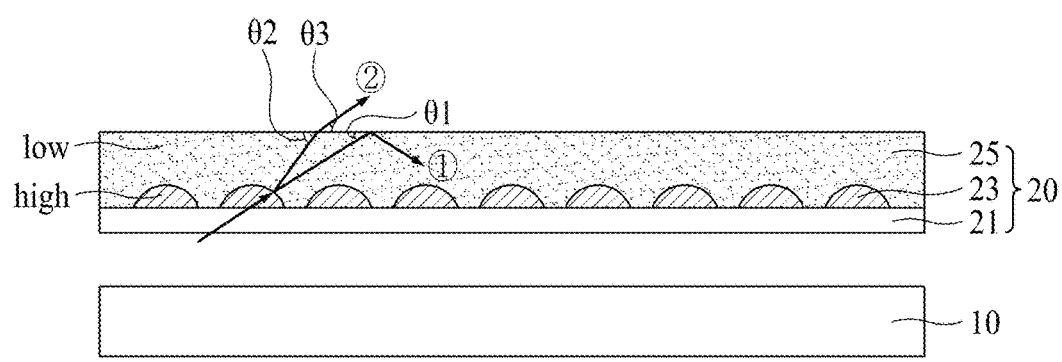

FIGS. 2A and 2B illustrate that an optical path is adjusted by each wavelength range in the display device according to one embodiment of the present disclosure shown in FIG. 1.

In case of FIG. 2A, the plurality of dome patterns 23 have the low refractive index, and the cover layer 25 has the high refractive index.

As shown in FIG. 2A, the light, which is emitted from the display panel 10 and is then incident on the optical-path adjustment film 20, passes through the interface between the base layer 21 and the plurality of dome patterns 23, wherein the refractive index of the base layer 21 is the same as the refractive index of the plurality of dome patterns 23.

After that, when the light advances from the plurality of dome patterns 23 having the low refractive index toward the cover layer 25 having the high refractive index, the light refraction by each wavelength range is changed on the interface between the cover layer 25 and the plurality of dome patterns 23. In detail, the light (①) having the short wavelength, for example, blue light is refracted at a first angle ($\theta 1$) on the upper surface of the cover layer 25, and the light (②) having the long wavelength, for example, red light is refracted at a second angle ($\theta 2$) on the upper surface of the cover layer 25. That is, in comparison to the light (②) having the long wavelength, the light (①) having the short wavelength is refracted to be nearly vertical while passing through the interface between the plurality of dome patterns 23 and the cover layer 25.

Then, the light (①) having the short wavelength and the light (②) having the long wavelength, refracted on the interface between the cover layer 25 and the plurality of dome patterns 23, may be again refracted on the upper surface of the cover layer 25. In this case, an upper side of the cover layer 25 may be formed of an air layer, or a material layer whose refractive index is lower than that of the cover layer 25. Thus, the light (①) having the short wavelength is emitted at a third angle ($\theta 3$) on the upper surface of the cover layer 25, and the light (②) having the long wavelength is emitted at a fourth angle ($\theta 4$) on the upper surface of the cover layer 25.

Eventually, the third angle (θ3) at which the light (①) having the short wavelength is emitted on the upper surface of the cover layer 25 is larger than the fourth angle (θ4) at which the light (②) having the long wavelength is emitted on the upper surface of the cover layer 25. Thus, at the lateral viewing angle direction, an emission amount of the light (②) having the long wavelength may be increased in comparison to an emission amount of the light (①) having the short wavelength so that it is possible to overcome a problem related with a bluish image in the display device.

In case of FIG. 2B, the plurality of dome patterns 23 have the high refractive index, and the cover layer 25 has the low refractive index.

As shown in FIG. 2B, the light, which is emitted from the display panel 10 and is then incident on the optical-path adjustment film 20, passes through the interface between the base layer 21 and the plurality of dome patterns 23, wherein the refractive index of the base layer 21 is the same as the refractive index of the plurality of dome patterns 23.

After that, when the light advances from the plurality of dome patterns 23 having the high refractive index toward the cover layer 25 having the low refractive index, the light refraction by each wavelength range is changed on the interface between the cover layer 25 and the plurality of dome patterns 23. In detail, the light (①) having the short wavelength, for example, blue light is refracted at a first angle (θ1) on the upper surface of the cover layer 25, and the light (②) having the long wavelength, for example, red light is refracted at a second angle (θ2) on the upper surface of the cover layer 25. That is, in comparison to the light (①) having the short wavelength, the light (②) having the long wavelength is refracted to be nearly vertical while passing through the interface between the plurality of dome patterns 23 and the cover layer 25.

Then, the light (①) having the short wavelength and the light (②) having the long wavelength, refracted on the interface between the cover layer 25 and the plurality of dome patterns 23, may be again refracted on the upper surface of the cover layer 25.

In this case, the first angle (θ1) obtained when the light (①) having the short wavelength is refracted on the upper surface of the cover layer 25 is small so that the light (①) having the short wavelength might be totally reflected on the upper surface of the cover layer 25 without being emitted to the outside. Meanwhile, the second angle (θ2) obtained when the light (②) having the long wavelength is refracted on the upper surface of the cover layer 25 is relatively larger than the first angle (θ1) so that the light (②) having the long wavelength is emitted at a third angle (θ3) on the upper surface of the cover layer 25.

Thus, at the lateral viewing angle direction, an emission amount of the light (②) having the long wavelength may be increased in comparison to an emission amount of the light (①) having the short wavelength so that it is possible to overcome a problem related with a bluish image in the display device.

As shown in FIGS. 2A and 2B, according to one embodiment of the present disclosure, the emission amount of the light on the upper surface of the cover layer 25 is adjusted by each wavelength range by properly adjusting the refractive index of the plurality of dome patterns 23 and the cover layer 25, to thereby overcome the problem related with the bluish image at the lateral viewing angle. That is, when the light passes through the interface between the high refractive index layer and the low refractive index layer, the refraction pattern of the light is changed by each wavelength range so that it is possible to improve picture quality of the display device.

Preferably, the refractive index difference between the plurality of dome patterns 23 and the cover layer 25 may be within a range of 0.05 to 0.4. If the refractive index difference is not within the above range, the effect for solving the problem related with the bluish image is deteriorated due to the decreased emission amount of the light (②) having the long wavelength in the structure of FIG. 2A, and the effect for solving the problem related with the bluish image is deteriorated due to the increased emission amount of the light (①) having the short wavelength in the structure of FIG. 2B.

If not providing the optical-path adjustment film 20, the bluish image is displayed at the lateral viewing angle of the display panel 10. However, if the optical-path adjustment film 20 is provided on the upper surface of the display panel 10, the emission amount of the light having the long wavelength range is relatively increased in comparison to the emission amount of the light having the short wavelength range at the lateral viewing angle so that it is possible to overcome the problem of the bluish image at the lateral viewing angle of the display panel 10 through the use of optical-path adjustment film 20, thereby displaying high-resolution image, and furthermore, improving picture quality of the display device.

Figure 3:
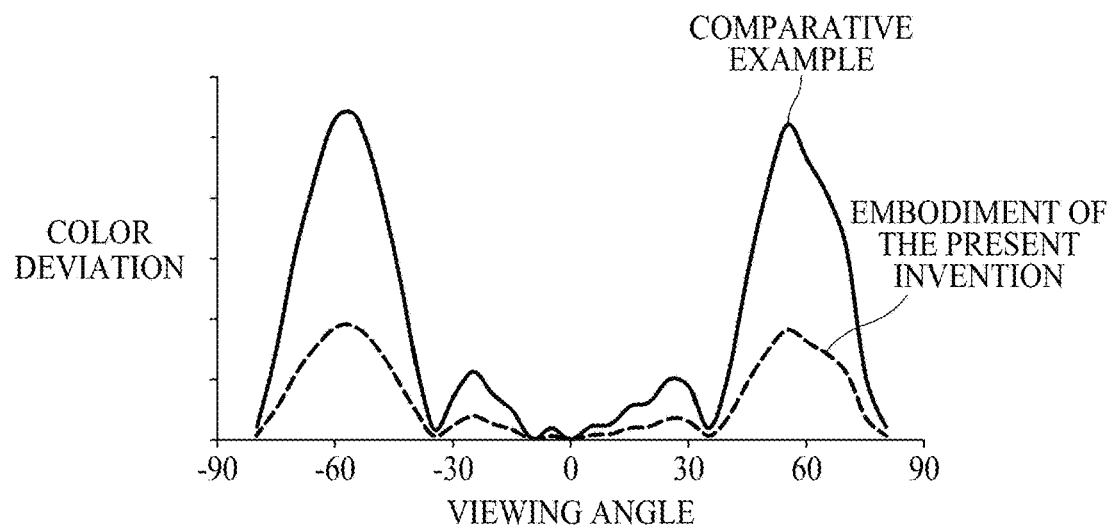
FIG. 3 is a graph illustrating color deviation in accordance with a viewing angle in the display device according to the comparative example and the display device according to the embodiment of the present disclosure.
Figure 4:
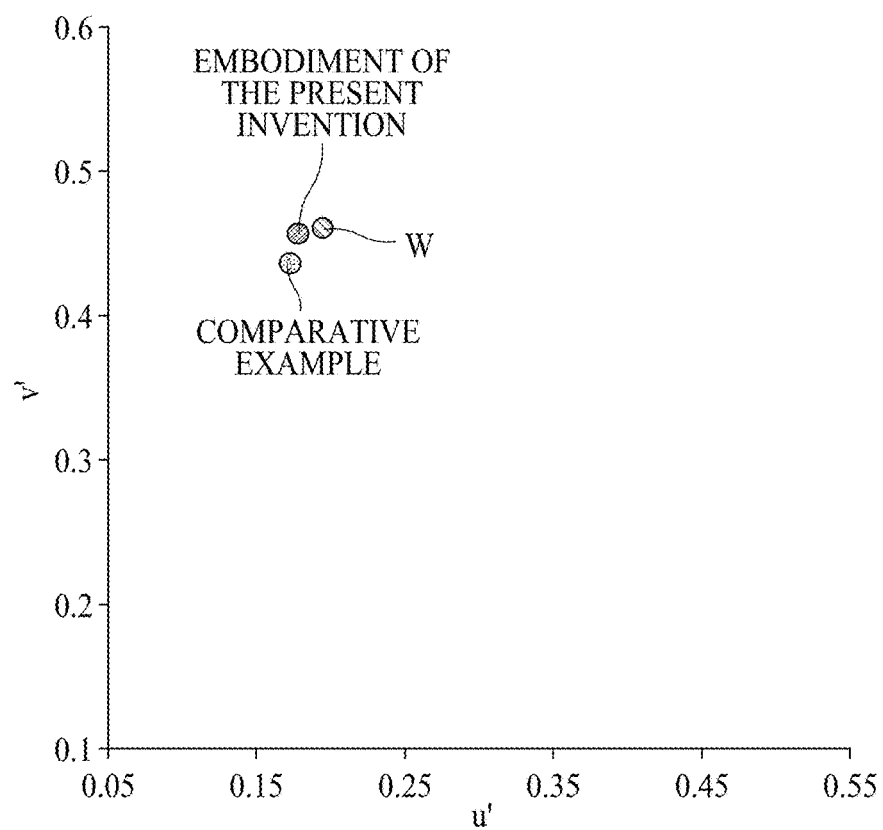
FIG. 4 is a graph illustrating white (W) color coordinates value in the display device according to the comparative example and the display device according to the embodiment of the present disclosure.

FIG. 3 is a graph illustrating color deviation in accordance with a viewing angle in the display device according to the comparative example and the display device according to the embodiment of the present disclosure, and FIG. 4 is a graph illustrating white (W) color coordinates value in the display device according to the comparative example and the display device according to the embodiment of the present disclosure.

In FIGS. 3 and 4, the comparative example uses the electroluminescent display panel without the optical-path adjustment film, and the embodiment of the present disclosure uses the electroluminescent display panel with the optical-path adjustment film of FIG. 1.

In FIG. 3, the horizontal axis is the viewing angle, and the vertical axis is the color deviation. That is, the horizontal axis shows the lateral viewing angle which is increased toward the left and right sides with respect to the front viewing angle corresponding to 0°, and the vertical axis shows the color deviation between the color coordinates value at the front viewing angle and the color coordinates value at each viewing angle.

As shown in FIG. 3, in case of the comparative example, when the lateral viewing angle is 60°, the color deviation becomes large. Meanwhile, in case of the embodiment of the present disclosure, when the lateral viewing angle is 60°, the color deviation is largely decreased in comparison to the comparative example. That is, in case of the comparative example, white color in the lateral viewing angle is largely different from white color in the front viewing angle. However, in case of the embodiment of the present disclosure, the color difference between white color in the lateral viewing angle and white color in the front viewing angle is relatively small.

As shown in FIG. 4, in case of the comparative example, the white color is largely moved to the left side of the pure white color coordinates. In FIG. 4, the horizontal axis u' represents x axis of CIE 1976 Color Coordinate and the vertical axis v' represents y axis of CIE 1976 Color Coordinate. Thus, in case of the comparative example, it may cause the problem related with the bluish image. Meanwhile, in case of the embodiment of the present disclosure, the white color is closer to the pure white color coordinates in comparison to the comparative example. Thus, in case of the embodiment of the present disclosure, it is possible to overcome the problem related with the bluish image.

Figure 5:
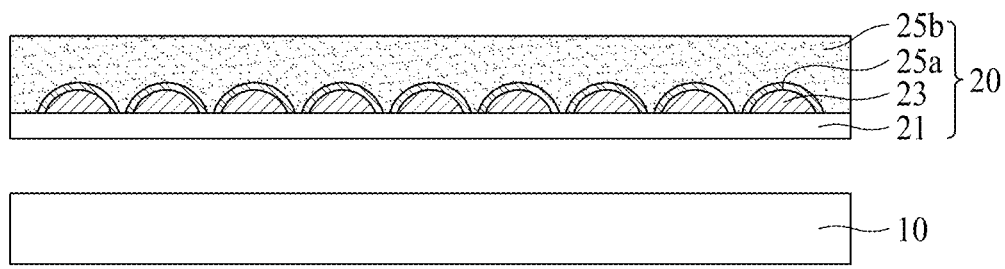
FIG. 5 is a schematic view illustrating a display device according to another embodiment of the present disclosure.

FIG. 5 is a schematic view illustrating a display device according to another embodiment of the present disclosure. Except that a cover layer 25 includes first and second cover layers 25a and 25b, the display device of FIG. 5 is the same as the display device of FIG. 1, whereby the same reference numbers will be used throughout the drawings to refer to the same or like parts, and a detailed description for the same parts will be omitted.

As shown in FIG. 5, an optical-path adjustment film 20 provided on an upper surface of a display panel 10 may include a base layer 21, a plurality of dome patterns 23, and a cover layer 25.

In this case, the cover layer 25 may include first and second cover layers 25a and 25b. The first cover layer 25a is provided on an upper surface of the plurality of dome patterns 23, and the second cover layer 25b is provided on an upper surface of the first cover layer 25a.

A cross sectional structure of an upper surface of the first cover layer 25a corresponds to a cross sectional structure of an upper surface of the dome pattern 23. That is, the upper surface of the first cover layer 25a may have a curved-line shaped cross sectional structure. The plurality of first cover layers 25a may be individually formed on the upper surface of the plurality of dome patterns 23 while being provided at fixed intervals, but not limited to this structure. For example, one of the first cover layer 25a may be continuously provided on the upper surface of the plurality of dome patterns 23 and the upper surface of the base layer 21.

In the structure of FIG. 5, the plurality of dome patterns 23 may be formed of a material whose refractive index is lower than that of the first cover layer 25a, and the second cover layer 25b is formed of a material whose refractive index is lower than that of the first cover layer 25a. According to another example, the plurality of dome patterns 23 may be formed of a material whose refractive index is higher than that of the first cover layer 25a, and the second cover layer 25b may be formed of a material whose refractive index is higher than that of the first cover layer 25a.

According to another embodiment of the present disclosure, the light being incident on the optical-path adjustment film 20 sequentially passes through the low refraction layer, the high refraction layer and the low refraction layer, or sequentially passes the high refraction layer, the low refraction layer and the high refraction layer so that it is possible to properly adjust the refractive index in each of the layers, that is, to precisely adjust the amount of light emitted to the upper surface of the optical-path adjustment film 20 by each wavelength range, thereby overcoming the problem related with the bluish image at the lateral viewing angle.

Figure 6:
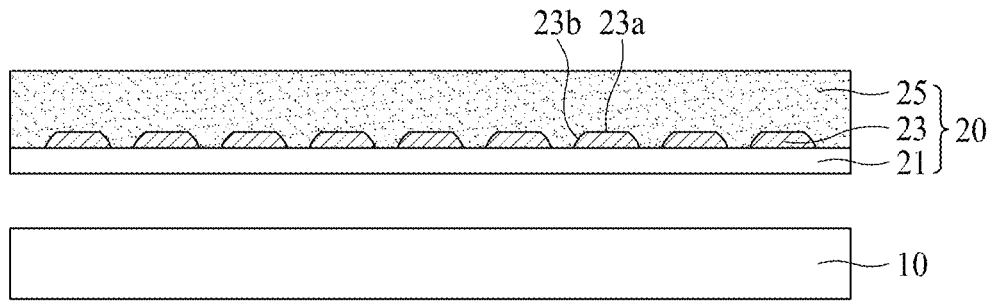
FIG. 6 is a schematic view illustrating a display device according to another embodiment of the present disclosure.

FIG. 6 is a schematic view illustrating a display device according to another embodiment of the present disclosure. Except that a dome pattern 23 is changed in its structure, the display device of FIG. 6 is the same as the display device of FIG. 1, whereby the same reference numbers will be used throughout the drawings to refer to the same or like parts, and a detailed description for the same parts will be omitted.

As shown in FIG. 6, an optical-path adjustment film 20 provided on an upper surface of a display panel 10 may include a base layer 21, a plurality of dome patterns 23, and a cover layer 25.

A cross sectional structure of an upper surface of the dome pattern 23 is different from that of FIG. 1. That is, referring to FIG. 6, some area of the upper surface of the dome pattern 23 is formed of a flattened surface 23a, and the remaining area of the upper surface of the dome pattern 23 is formed of a curved surface 23b. The flattened surface 23a corresponds to a central area of the upper surface of the dome pattern 23, and the curved surface 23b corresponds to a peripheral area of the upper surface of the dome pattern 23.

As shown in FIG. 6, the upper surface of the dome pattern 23 includes the flattened surface 23a so that it is possible to improve amount of the light emitted from the optical-path adjustment film 20 through the upper surface of the dome pattern 23, to thereby improve luminance of the display device.

Figure 7:
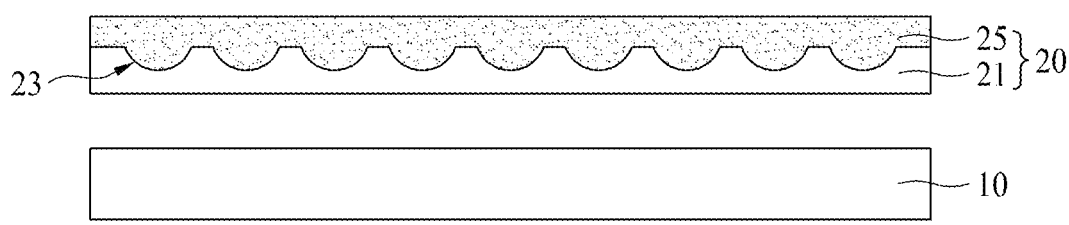
FIG. 7 is a schematic view illustrating a display device according to another embodiment of the present disclosure.

FIG. 7 is a schematic view illustrating a display device according to another embodiment of the present disclosure.

As shown in FIG. 7, the display device according to another embodiment of the present disclosure may include a display panel 10, and an optical-path adjustment film 20 provided on an upper surface of the display panel 10.

The optical-path adjustment film 20 may include a base layer 21, and a cover layer 25.

A plurality of dome patterns 23 may be provided on an upper surface of the base layer 21. The plurality of dome patterns 23 may be formed in a concave-pattern structure inside the base layer 21. A lower surface of the dome pattern 23 has a curved-line shaped cross sectional structure, for example, arch-shaped structure. Herein, the lower surface in each of the plurality of dome patterns 23 may have the same cross sectional structure. As the plurality of dome patterns 23 are formed in the concave-pattern structure inside the base layer 21, the lower surface of the plurality of dome patterns 23 forms some of the upper surface of the base layer 21.

The cover layer 25 is provided on the upper surface of the base layer 21. The cover layer 25 is provided to fill the inside of the concave pattern in the plurality of dome patterns 23. Thus, the lower surface of the cover layer 25 is in contact with the upper surface of the base layer 21. Specifically, the lower surface of the cover layer 25 is in contact with the lower surface of the plurality of dome patterns 23. The upper surface of the cover layer 25 may be flattened.

The cover layer 25 and the base layer 21 may be formed of the different materials from each other. The cover layer 25 may be formed of the relatively high refraction material or relatively low refraction material in comparison to the base layer 21.

The optical-path adjustment film 20 including the base layer 21 and the cover layer 25 may be attached onto the upper surface of the display panel 10 by the use of adhesive layer, but not limited to this structure.

However, it is possible to form the optical-path adjustment film 20 onto the upper surface of the display panel 10 without using an additional adhesive layer. In this case, the base layer 21 may be directly coated onto the upper surface of the display panel 10, and then the cover layer 25 may be formed thereon.

Figure 8:
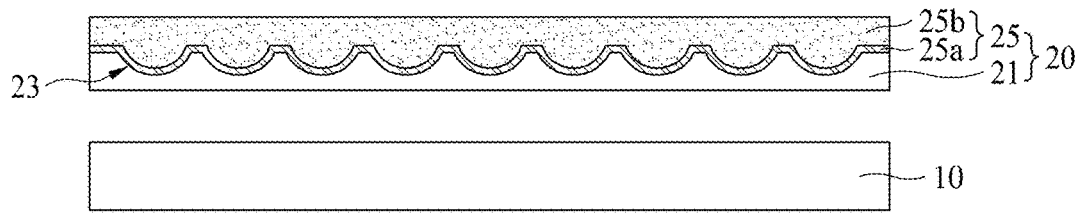
FIG. 8 is a schematic view illustrating a display device according to another embodiment of the present disclosure.

FIG. 8 is a schematic view illustrating a display device according to another embodiment of the present disclosure. Except that a cover layer 25 includes first and second cover layers 25a and 25b, the display device of FIG. 8 is the same as the display device of FIG. 7, whereby the same reference numbers will be used throughout the drawings to refer to the same or like parts, and a detailed description for the same parts will be omitted.

As shown in FIG. 8, an optical-path adjustment film 20 provided on an upper surface of a display panel 10 may include a base layer 21, and a cover layer 25.

In this case, the cover layer 25 may include first and second cover layers 25a and 25b. The first cover layer 25a is provided on an upper surface of the base layer 21, and the second cover layer 25b is provided on an upper surface of the first cover layer 25a.

A cross sectional structure of a lower surface of the first cover layer 25a corresponds to a cross sectional structure of a lower surface of a dome pattern 23 provided in a concave-pattern structure inside the base layer 21. That is, the lower surface of the first cover layer 25a has a curved-line shaped cross sectional structure. The plurality of first cover layers 25a may be continuously formed on an entire upper surface of the base layer 21 including an upper surface of the plurality of dome patterns 23. If needed, the plurality of first cover layers 25a may be individually formed on the upper surface of the plurality of dome patterns 23 while being provided at fixed intervals.

In the structure of FIG. 8, the base layer 21 may be formed of a material whose refractive index is lower than that of the first cover layer 25a, and the second cover layer 25b may be formed of a material whose refractive index is lower than that of the first cover layer 25a. According to another example, the base layer 21 may be formed of a material whose refractive index is higher than that of the first cover layer 25a, and the second cover layer 25b may be formed of a material whose refractive index is higher than that of the first cover layer 25a.

Figure 9:
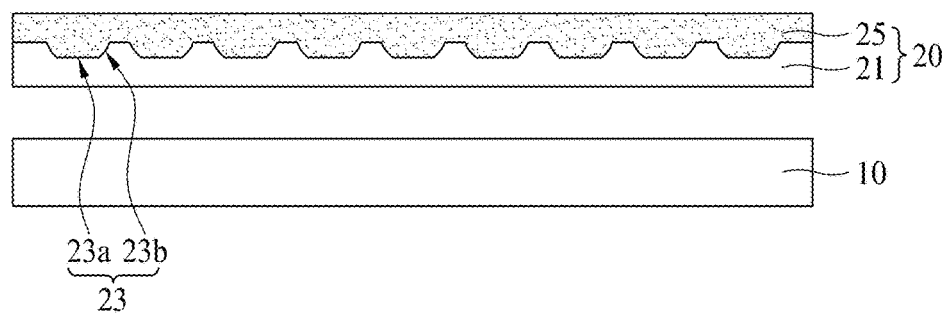
FIG. 9 is a schematic view illustrating a display device according to another embodiment of the present disclosure.

FIG. 9 is a schematic view illustrating a display device according to another embodiment of the present disclosure. Except that a dome pattern 23 is changed in its structure, the display device of FIG. 9 is the same as the display device of FIG. 7, whereby the same reference numbers will be used throughout the drawings to refer to the same or like parts, and a detailed description for the same parts will be omitted.

As shown in FIG. 9, an optical-path adjustment film 20 provided on an upper surface of a display panel 10 may include a base layer 21 having a plurality of dome patterns 23, and a cover layer 25.

A cross sectional structure of a lower surface of the dome pattern 23 is different from that of FIG. 7. That is, referring to FIG. 9, some area of the lower surface of the dome pattern 23 is formed of a flattened surface 23a, and the remaining area of the lower surface of the dome pattern 23 is formed of a curved surface 23b. The flattened surface 23a corresponds to a central area of the lower surface of the dome pattern 23, and the curved surface 23b corresponds to a peripheral area of the lower surface of the dome pattern 23.

As shown in FIG. 9, the lower surface of the dome pattern 23 includes the flattened surface 23a so that it is possible to improve amount of the light emitted from the optical-path adjustment film 20 through the lower surface of the dome pattern 23, to thereby improve luminance of the display device.

Figure 10:
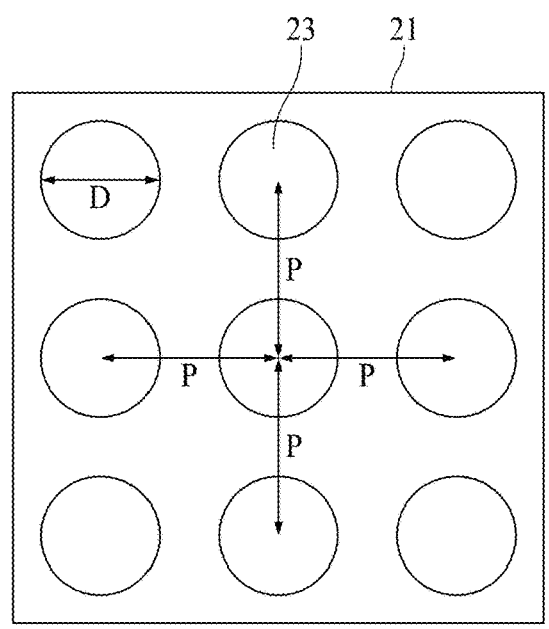
FIG. 10 is a plane view illustrating an arrangement structure of a plurality of dome patterns according to one embodiment of the present disclosure.

FIG. 10 is a plane view illustrating an arrangement structure of the plurality of dome patterns according to one embodiment of the present disclosure.

As shown in FIG. 10, the plurality of dome patterns 23 are formed on the base layer 21. On the plane, the plurality of dome patterns 23 may be formed in a circular structure, but not limited to this structure. If needed, the plurality of dome patterns 23 may be formed in an elliptical structure, or a polygonal structure such as a pentagonal structure or a hexagonal structure.

The plurality of dome patterns 23 may have the same diameter (D), whereby the plurality of dome patterns 23 may have the same size. In this case, the diameter (D) in each of the plurality of dome patterns 23 may be set within a range of 1 μm to 20 μm. If the diameter (D) in each of the plurality of dome patterns 23 is not within the above range, it is difficult to obtain the optical-path change effects by each wavelength range. A pitch (P) between each of the plurality of dome patterns 23 may be the same, whereby the plurality of dome patterns 23 may be regularly arranged in a matrix configuration.

A pattern fill factor corresponding to a ratio of an entire size of the plurality of dome patterns 23 to an entire area of the base layer 21 may be set as 20% to 100%. If the pattern fill factor is less than 20%, it is difficult to obtain the optical-path change effects by each wavelength range.

The pattern fill factor may be changed by adjusting the pitch (P) between each of the plurality of dome patterns 23. For example, if the pitch (P) between each of the plurality of dome patterns 23 is the same as the diameter (D) of the dome pattern 23, the plurality of dome patterns 23 are in contact with each other, to thereby increase the pattern fill factor. If the plurality of dome patterns 23 are formed in the circular or elliptical shape on the plane, it is possible to increase the pattern fill factor by reducing the diameter (D) in each of the plurality of dome patterns 23. However, if the plurality of dome patterns 23 are formed in the circular or elliptical shape on the plane, it is difficult to realize the pattern fill factor of 100%. In order to realize the pattern fill factor of 100%, the plurality of dome patterns 23 are formed in the polygonal structure on the plane, and the polygonal-shaped dome patterns 23 are arranged to be in contact with each other.

Figure 11:
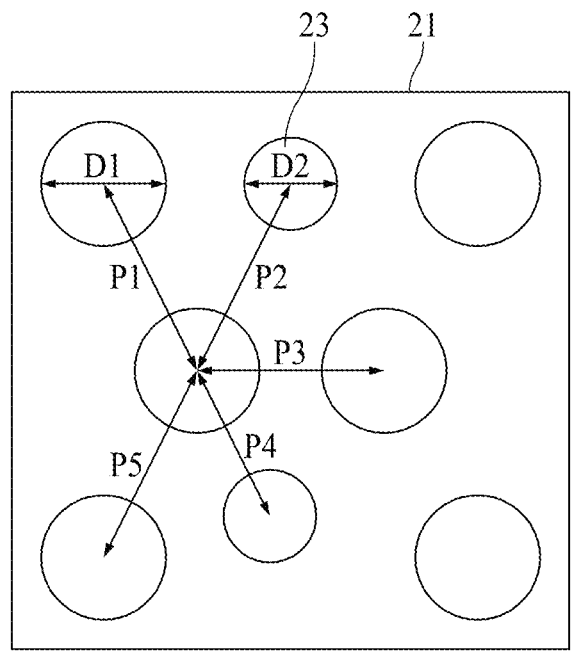
FIG. 11 is a plane view illustrating an arrangement structure of a plurality of dome patterns according to another embodiment of the present disclosure.

FIG. 11 is a plane view illustrating an arrangement structure of the plurality of dome patterns according to another embodiment of the present disclosure.

In FIG. 10, the plurality of dome patterns 23, which have the same diameter (D), are regularly arranged with the same pitch (P). Meanwhile, in case of FIG. 11, the plurality of dome patterns 23, which have the different diameters (D1, D2), are irregularly arranged with the different pitches (P1, P2, P3, P4, P5).

That is, as shown in FIG. 11, any one dome pattern 23 has the first diameter (D1), and another dome pattern 23 has the second diameter (D2). That is, the plurality of dome patterns 23 may include at least two dome patterns 23 with the different sizes. Also, at least two pitches (P1, P2, P3, P4, P5) among the first to fifth pitches (P1, P2, P3, P4, P5), which are provided between the adjacent dome patterns 23 with respect to any one dome pattern 23, may be different from each other.

According to another embodiment of the present disclosure, the plurality of dome patterns 23 may have the different diameters (D1, D2) and the different pitches (P1, P2, P3, P4, P5), and the plurality of dome patterns 23 may be arranged irregularly instead of being arranged regularly. In this case, it is possible to minimize a moire phenomenon.

FIGS. 12 to 15 are cross sectional views illustrating display devices according to the embodiments of the present disclosure, which will be described as follows.

Figure 12:
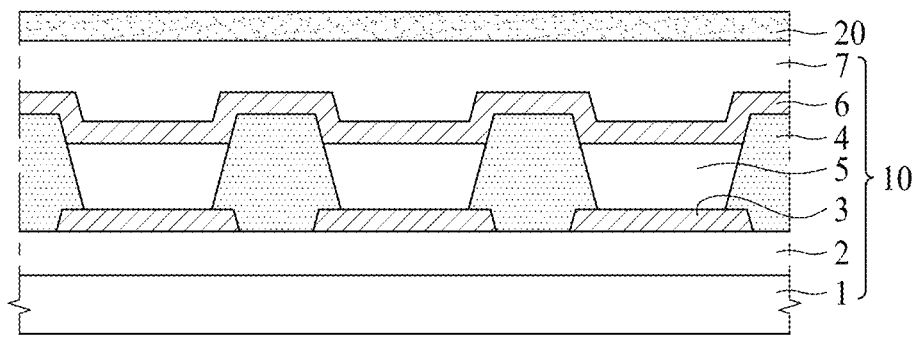
FIGS. 12 to 15 are cross sectional views illustrating display devices according to the embodiments of the present disclosure.

As shown in FIG. 12, the display device according to another embodiment of the present disclosure may include a display panel 10, and an optical-path adjustment film 20.

The display panel 10 may be formed of an electroluminescent display panel including a substrate 1, a circuit device layer 2, an anode 3, a bank 4, an emission layer 5, a cathode 6, and an encapsulation layer 7.

The circuit device layer 2 is provided on an upper surface of the substrate 1. The circuit device layer 2 is provided with various signal lines, a thin film transistor, and a capacitor. The anode 3 is provided on an upper surface of the circuit device layer 2. The anode 3 is patterned by each pixel. The bank 4, which covers both ends of the anode 3, is provided on the upper surface of the circuit device layer 2. The bank 4 is formed in a matrix configuration, to thereby define a plurality of light emission areas. The emission layer 5 is formed in the plurality of light emission areas defined by the bank 4. The cathode 6 is provided on an upper surface of the emission layer 5. The cathode 6 may be provided on an upper surface of the bank 4, whereby the cathode 6 may be provided on an entire area of the plurality of pixels. The encapsulation layer 7 may be provided on an upper surface of the cathode 6, wherein the encapsulation layer 7 prevents a moisture permeation into the emission layer 5.

A structure of the electroluminescent display panel may be changed to various types generally known to those in the art.

The optical-path adjustment film 20 is provided on an upper surface of the display panel 10. In detail, the optical-path adjustment film 20 may be provided on an upper surface of the encapsulation film 7. The optical-path adjustment film 20 may be formed in various structures according to the aforementioned embodiments of the present disclosure.

Figure 13:
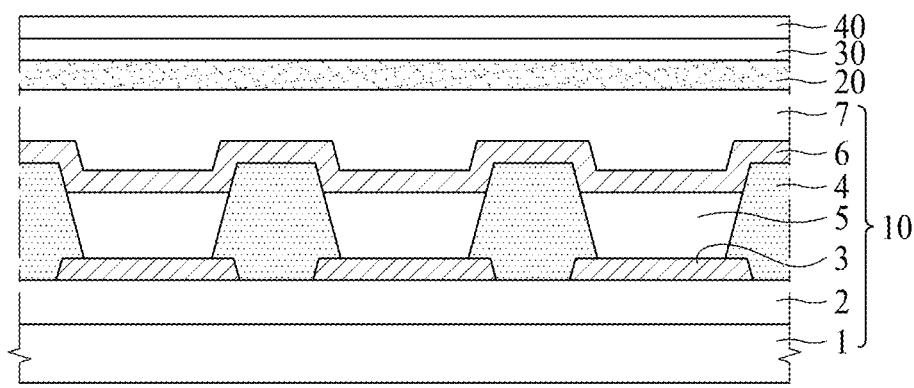
Figure 14:
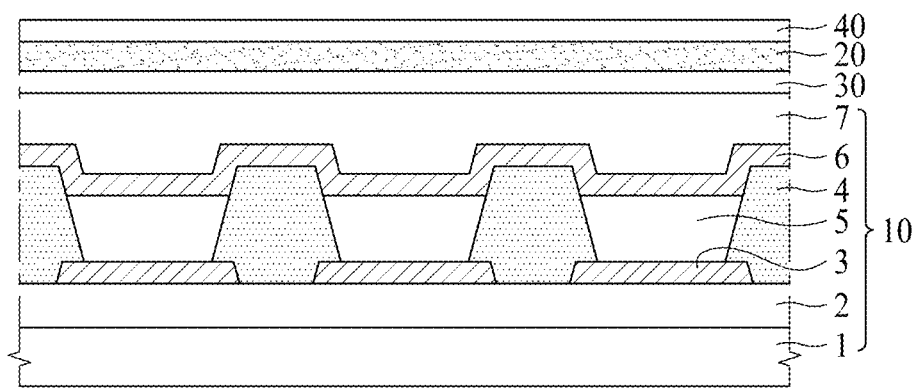
Figure 15:
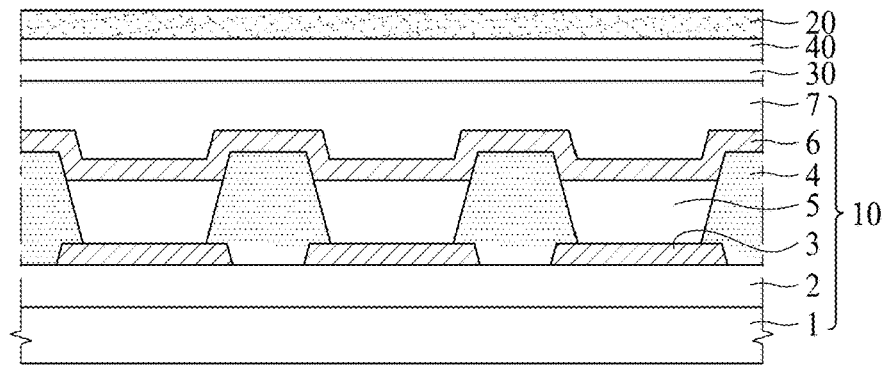

FIGS. 13 to 15 show display devices in which a polarizing film 30 and a cover film 40 are additionally provided on an upper surface of the display panel 10. The polarizing film 30 prevents a reflection of ambient light, and the cover film 40 protects the polarizing film 30. The cover film 40 may be formed of a transparent material such as glass.

As shown in FIG. 13, the optical-path adjustment film 20 according to the aforementioned embodiments of the present disclosure may be provided between the display panel 10 and the polarizing film 30. In this case, the optical-path adjustment film 20, the polarizing film 30, and the cover film 40 may be sequentially deposited on the upper surface of the display panel 10.

As shown in FIG. 14, the optical-path adjustment film 20 according to the aforementioned embodiments of the present disclosure may be provided between the polarizing film 30 and the cover film 40. In this case, the polarizing film 30, the optical-path adjustment film 20, and the cover film 40 may be sequentially deposited on the upper surface of the display panel 10.

As shown in FIG. 15, the optic-path adjustment film 20 according to the aforementioned embodiments of the present disclosure may be provided on the upper surface of the cover film 40. In this case, the polarizing film 30, the cover film 40, and the optical-path adjustment film 20 may be sequentially deposited on the upper surface of the display panel 10.

According to the embodiment of the present disclosure, the optical-path adjustment film 20 is provided on the upper surface of the display panel 10 so that the refractive index of the emitted light is adjusted by each wavelength range, to thereby overcome the problem related with the bluish image at the lateral viewing angle. In addition, as the optical-path adjustment film 20 is provided on the upper surface of the display panel 10 according to the embodiment of the present disclosure, it is possible to overcome problems related with lattice pattern and motion blur on the displayed image, which will be described as follows.

Figure 16:
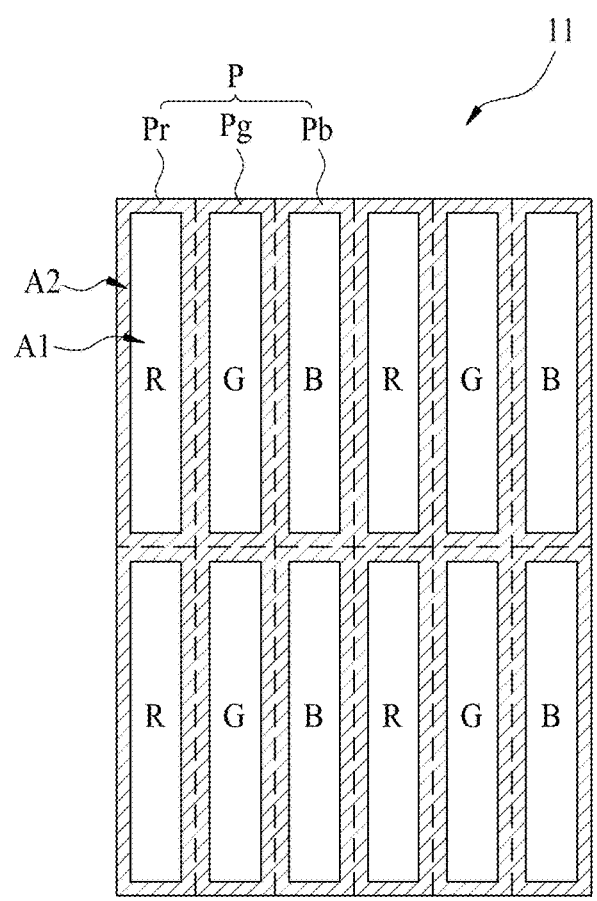
FIG. 16 illustrates a sub-pixel arrangement of a display panel according to one embodiment of the present disclosure.

FIG. 16 illustrates a sub-pixel arrangement of the display panel according to one embodiment of the present disclosure.

As shown in FIG. 16, the display panel 10 is provided with the plurality of pixels (P), wherein each pixel (P) includes red, green, and blue sub pixels (Pr, Pg, Pb), to thereby display various color images through the use of pixels (P).

Each sub pixel (Pr, Pg, Pb) has an opening area (A1) and a non-opening area (A2), wherein the opening area (A1) corresponds to a light emission area in the sub pixel (Pr, Pg, Pb), and the non-opening area (A2) corresponds to a non emission area in the sub pixel (Pr, Pg, Pb).

In this case, a lattice pattern by the plurality of non-opening areas (A2) connected with each other may be seen (perceived) by a user, which may deteriorate picture quality of the display device. Namely, the user might see slight dark regions between pixels in the areas (A2)

Figure 17:
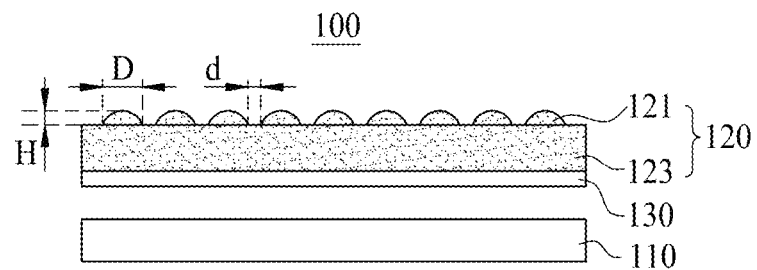
FIG. 17 illustrates a display device according to another embodiment of the present disclosure.

However, there is a limitation on the size decrease of the non-opening area (A2) in the sub pixel (Pr, Pg, Pb) due to a manufacturing process margin. Thus, to improve the viewing quality, the inventors have created different methods for realizing a clear image with high resolution, and reducing the lattice pattern. Especially, in case of virtual reality (VR) device, an image is seen under the condition a user's eye is very close to a screen, problems such as the lattice pattern and image blur might become significant. The inventors have found a way to overcome these problems. FIG. 17 illustrates a display device according to another embodiment of the present disclosure.

Referring to FIG. 17, the display device 100 according to another embodiment of the present disclosure may include a display panel 110 having a plurality of pixels, wherein each pixel includes a plurality of sub pixels, an optical-path adjustment film 120 having a first refractive index provided on the display panel 110, and an optical adhesive film 130 disposed between the display panel 110 and the optical-path adjustment film 120.

The optical-path adjustment film 120 may include a base film 123, and a plurality of dome patterns 121 provided on an upper surface of the base film 123.

That is, the plurality of dome patterns 121 may be disposed on the upper surface of the base film 123, and the optical adhesive film 130 may be disposed on an opposite surface, that is, a lower surface of the base film 123. Also, the optical-path adjustment film 120 and the display panel 110 may be attached to each other by the use of optical adhesive film 130.

The dome pattern 121 may be smaller than each sub pixel (Pr, Pg and Pb of FIG. 1). That is, the plurality of dome patterns 121 may be provided in each sub pixel (Pr, Pg and Pb of FIG. 1).

In order to prevent light emitted from the sub pixel (Pr, Pg and Pb of FIG. 1) from being visible in the vacant space between each of the plurality of dome patterns 121 by the color dispersion, a diameter (D) in each of the dome patterns 121 included in the optical-path adjustment film 120 may be larger than a distance (d) between each of the plurality of dome patterns 121. For example, the diameter (D) in each of the dome patterns 121 may be within a range of 1 μm to 20 μm, and the distance (d) between each of the dome patterns 121 may be 5 μm or less than 5 μm, but not limited to these ranges.

In order to realize a clear image on the display device 100 and to prevent the lattice pattern from being seen by a user, a ratio of height (H) to diameter (D) in the dome pattern 121 is within a range of 0.05 to 2. Preferably, the height (H) of the dome pattern 121 may be smaller than the diameter (D) of the dome pattern 121, and a ratio of height (H) to diameter (D) in the dome pattern 121 may be within a range of 0.1 to 0.5, but not limited to these ranges.

The optical-path adjustment film 120 may be formed of resin, for example, polyethylene terephthalate (PET), polycarbonate (PC), or acryl-based material, but not limited to these materials.

The optical adhesive film (optically clear adhesive) 130 may be formed of resin, and the optical adhesive film 130 may be double-sided tape coated with optical adhesive, but not limited to this type.

The display device 100 according to the embodiment of the present disclosure adjusts the path of light emitted from the display panel 110 by the use of optical-path adjustment film 120. The method of adjusting the optical path by the use of optical-path adjustment film 120 will be described later.

Figure 18:
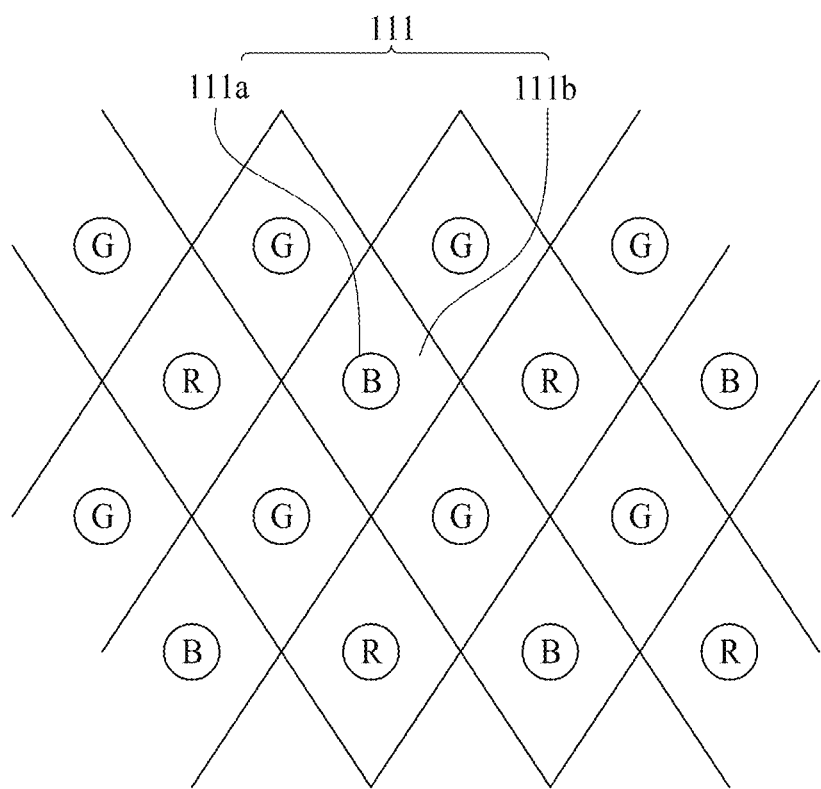
FIG. 18 illustrates a sub-pixel arrangement of a display panel according to another embodiment of the present disclosure.

FIG. 18 illustrates a sub-pixel arrangement of the display panel according to another embodiment of the present disclosure.

Referring to FIG. 18, a pentile structure may be formed in the display device 100 according to another embodiment of the present disclosure, wherein red and blue sub pixels (R, B) are alternately arranged in the same column, and a green sub pixel (G) is arranged in the adjacent column, but not limited to this structure. Each sub pixel 111 may include an opening area 111a and a non-opening area 111b.

In this case, the opening area 111a corresponds to a light emission area in the sub pixel 111, and the non-opening area 111b corresponds to a non emission area in the sub pixel 111.

In this case, a lattice pattern caused by the non-opening area 111b may be seen (perceived) by a user, which may deteriorate picture quality of the display device. However, as gate and data lines, and a thin film transistor (TFT) for driving the sub pixel 111 are formed in the non-opening area 111b, there is a limitation on the size decrease of the non-opening area 111b in the sub pixel 111 due to a manufacturing process margin.

Figure 19:
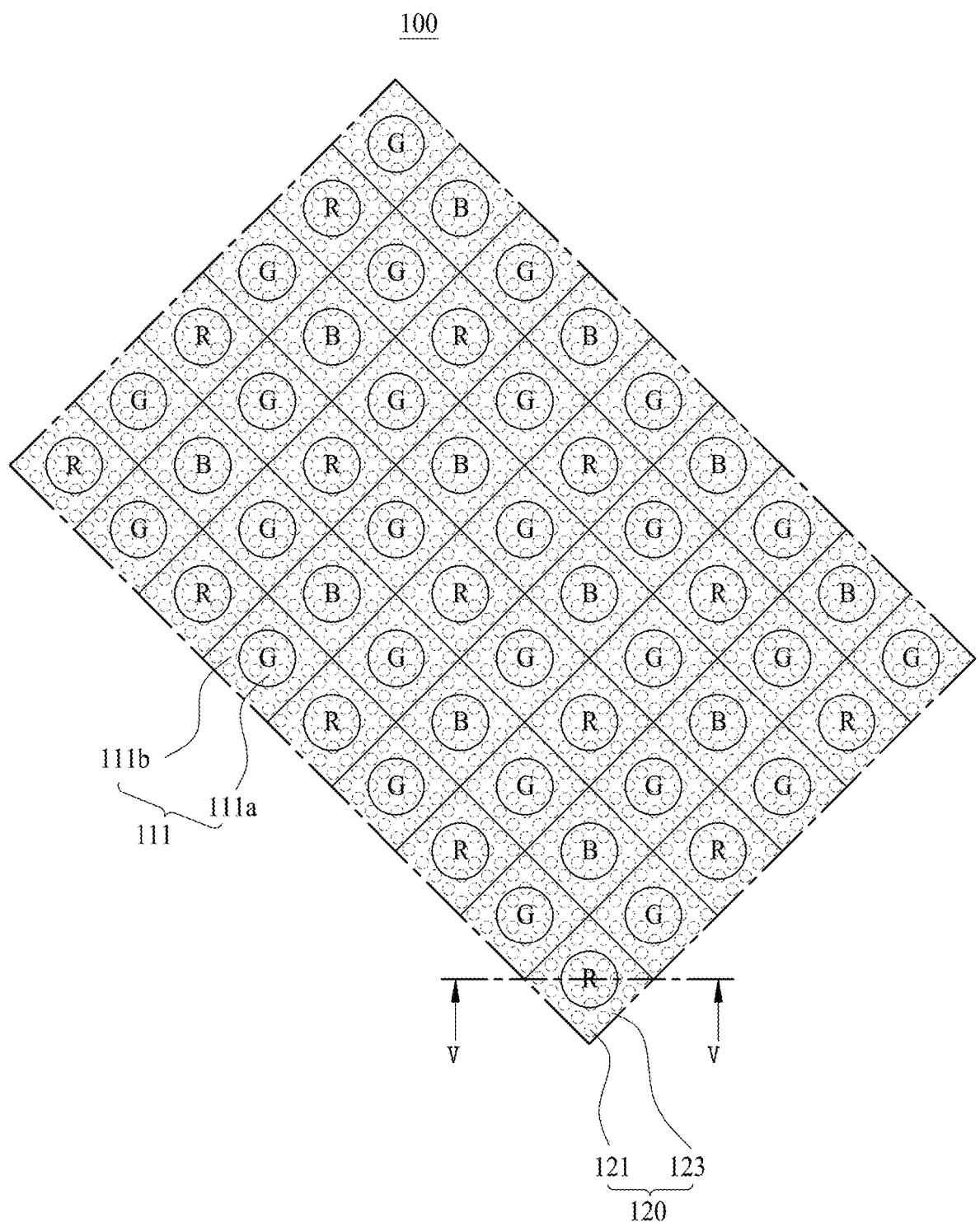
FIG. 19 is a plane view illustrating a display device according to another embodiment of the present disclosure.

FIG. 19 is a plane view illustrating a display device according to another embodiment of the present disclosure.

As shown in FIG. 19, in an arrangement of a sub pixel having a pentile structure, an optical-path adjustment film 120 may be disposed on the sub pixel 111.

As described above, each sub pixel 111 may include an opening area 111a and a non-opening area 111b, wherein the opening area 111a corresponds to a light emission area, and the non-opening area 111b corresponds to a non emission area. A plurality of dome patterns 121 included in the optical-path adjustment film 120 may be disposed on each sub pixel 111.

As shown in the drawings, the plurality of dome patterns 121 may be arranged regularly or irregularly.

In case of the optical-path adjustment film 120 according to another embodiment of the present disclosure, it has the micro dome pattern 121, whereby there is no need for aligning the dome pattern 121 of the optical-path adjustment film 120 and the opening area 111a of the sub pixel 111 in the display panel (See '110' of FIG. 17), to thereby simplify a manufacturing process.

Figure 20:
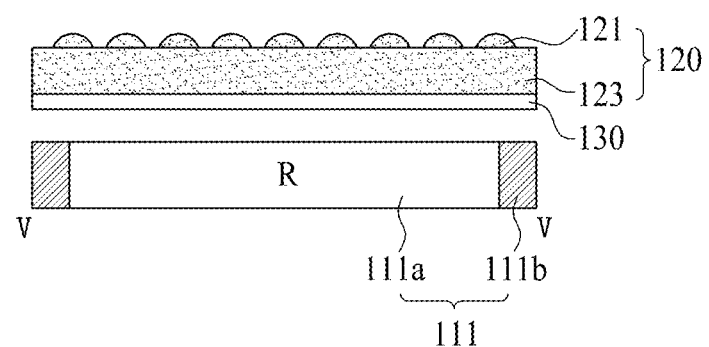
FIG. 20 is a cross sectional view along V-V of FIG. 19.

FIG. 20 is a cross sectional view along V-V of FIG. 19.

As shown in FIG. 20, there are one sub pixel 111 including the opening area 111a and the non-opening area 111b, an optical adhesive film 130 on one sub pixel 111, and the optical-path adjustment film 120 having a first refractive index on the optical adhesive film 130.

The optical-path adjustment film 120 may include a base film 123, and the plurality of dome patterns 121 on an upper surface of the base film 123.

Also, the optical adhesive film 130 is provided on a lower surface of the base film 123 so that the optical-path adjustment film 120 and the display panel (See '110' of FIG. 2) are attached to each other by the use of optical adhesive film 130.

Figure 21:
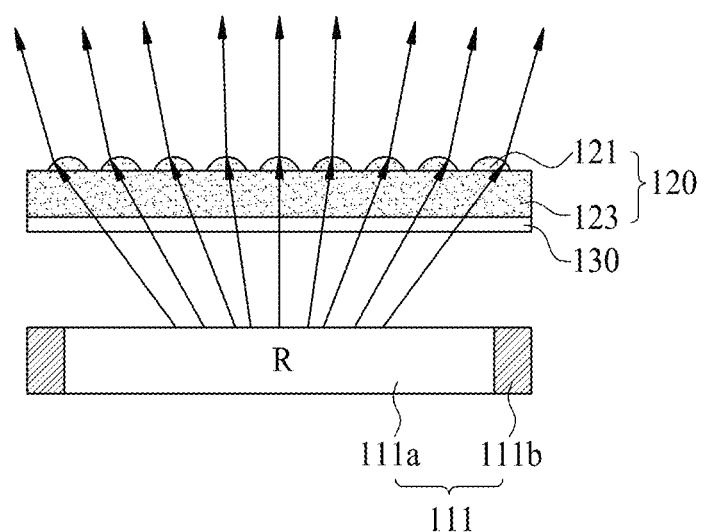
FIG. 21 illustrates an optical path when an optical-path adjustment film according to another embodiment of the present disclosure is provided.

FIG. 21 illustrates an optical path when the optical-path adjustment film according to another embodiment of the present disclosure is provided.

As shown in FIG. 21, light is not emitted through the non-opening area 111b of the sub pixel 111, and light emitted from the opening area 111a is refracted while passing through the optical-path adjustment film 120, and is extended to the area corresponding to the non-opening area 111b.

In this case, an air layer whose refractive index is smaller than the first refractive index may be provided on the optical-path adjustment film 120. For example, the refractive index of air layer may be '1', and the first refractive index may be '1.5' or '1.6', but not limited to these values.

That is, when light which is emitted to the invisible outside in the opening area 111a of the sub pixel 111 passes through the optical-path adjustment film 120, the light is refracted to a vertical direction due to the refractive index difference between the dome pattern 121 and the air layer provided on the dome pattern 121, whereby the light is emitted to the area corresponding to the non-opening area 111b as well as the area corresponding to the opening area 111a.

Accordingly, the output range of the sub pixel 111 may extend to the area corresponding to the non-opening area 111b.

Furthermore, when the light emitted from the opening area 111a passes through the optical-path adjustment film 120, its output range extends more by the diffraction.

Thus, if the light emitted from the sub pixel 111 passes through the optical-path adjustment film 120, the light is adjusted in such a way that its optical path advances toward the area corresponding to the opening area 111a, and also advances toward the area corresponding to the non-opening area 111b, whereby it enables to emit the visible light. As a result, it is possible to realize a clear image on the display device 100 and to prevent the non-opening areas 111b of the sub pixels 111 from being connected with each other and being seen as a lattice pattern by a user.

As described above, in case of the display device according to another embodiment of the present disclosure (See '100' of FIG. 19), the optical-path adjustment film 120 including the plurality of dome patterns 121 is provided on the display panel (See '110' of FIG. 17) so that the light emitted from the opening area 111a of each sub pixel 111 extends to the area corresponding to the non-opening area 111b.

In case of virtual reality (VR) device in which a user's eye is very close to a screen, it is therefore possible to overcome problems such as lattice pattern and image blur.

Hereinafter, a detailed description for the same parts of the entire structure will be omitted since it is redundant.

Figure 22A:
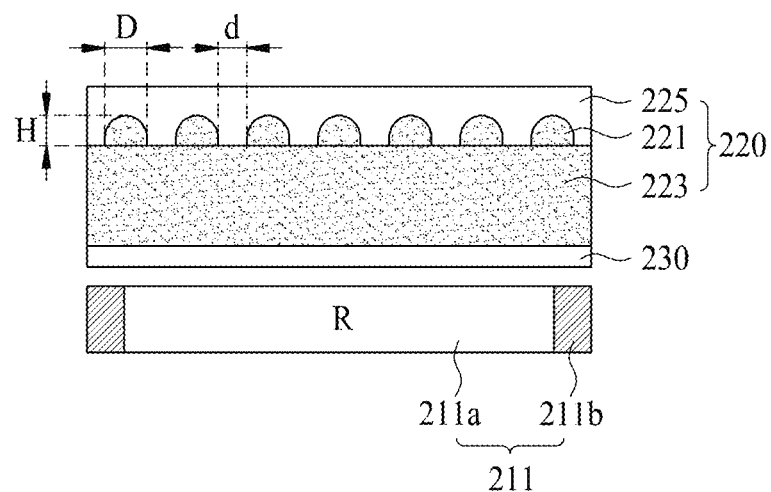
FIG. 22A is a cross sectional view illustrating an optical-path adjustment film arranged in a sub pixel of a display device according to another embodiment of the present disclosure.
Figure 22B:
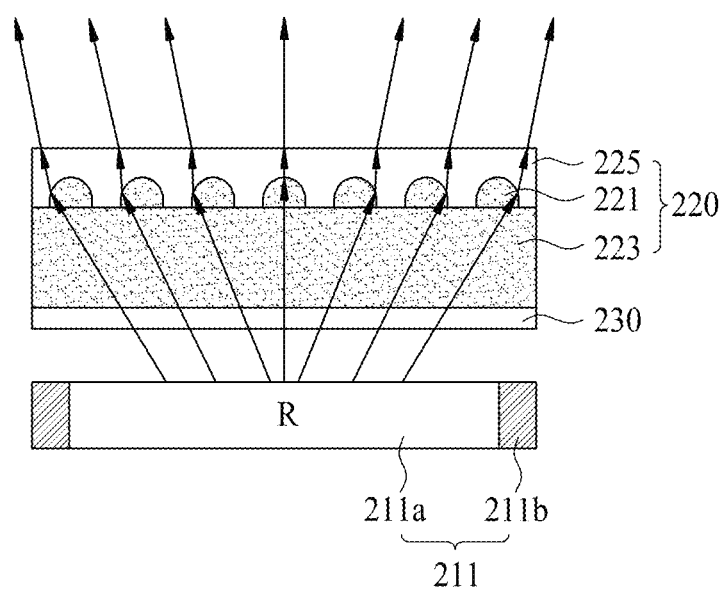
FIG. 22B illustrates an optical path in the display device provided with the optical-path adjustment film according to another embodiment of the present disclosure.

FIG. 22A is a cross sectional view illustrating an optical-path adjustment film arranged in a sub pixel of a display device according to another embodiment of the present disclosure. FIG. 22B illustrates an optical path in the display device provided with the optical-path adjustment film according to another embodiment of the present disclosure.

As shown in FIG. 22A, there are one sub pixel 211 including an opening area 211a and a non-opening area 211b, an optical adhesive film 230 on one sub pixel 211, and an optical-path adjustment film 220 on the optical adhesive film 230.

The optical-path adjustment film 220 according to another embodiment of the present disclosure may include a base film 223, a plurality of dome patterns 221 on an upper surface of the base film 223, and a cover layer 225 for covering the plurality of dome patterns 221.

That is, a lower surface of the cover layer 225 may cover the plurality of dome patterns 221, and an upper surface of the cover layer 225 may be flattened.

Also, the optical adhesive film 230 is provided on the lower surface of the base film 223 so that the optical-path adjustment film 220 and the display panel (See '110' of FIG. 17) are attached to each other by the use of optical adhesive film 230.

Especially, in case of the optical-path adjustment film 220 according to another embodiment of the present disclosure, the base film 223 and the plurality of dome patterns 221 may have a first refractive index, and the cover layer 225 may have a second refractive index which is smaller than the first refractive index. For example, the first refractive index may be 1.5 or 1.6, and the second refractive index may be within a range of 1.1 to 1.4, but not limited to these values.

The optical-path adjustment film 220 may be formed of resin, for example, polyethylene terephthalate (PET), polycarbonate (PC), or acryl-based material, but not limited to these materials.

The optical adhesive film (optically clear adhesive) 230 may be formed of resin, and the optical adhesive film 230 may be double-sided tape coated with optical adhesive, but not limited to this type.

In order to prevent light emitted from the sub pixel 211 from being visible in the vacant space between each of the plurality of dome patterns 221 by the color dispersion, a diameter (D) in each of the dome patterns 221 included in the optical-path adjustment film 220 may be larger than a distance (d) between each of the plurality of dome patterns 221. For example, the diameter (D) in each of the dome patterns 221 may be within a range of 1 μm to 20 μm, and the distance (d) between each of the dome patterns 221 may be 5 μm or less than 5 μm, but not limited to these ranges.

The optical-path adjustment film 220 according to another embodiment of the present disclosure includes the cover layer 225 provided on the base film 223 and the plurality of dome patterns 221, wherein the refractive index of the cover layer 225 is smaller than that of each of the base film 223 and the plurality of dome patterns 22. Thus, in order to adjust the optical path, a height (H) of the dome pattern 121 has to be greater than that of the aforementioned embodiment.

In order to realize a clear image on the display device (See '100' of FIG. 19) and to prevent the lattice pattern from being seen by a user, the height (H) of the dome pattern 221 of the optical-path adjustment film 220 is larger than the diameter (D) of the dome pattern 221 of the optical-path adjustment film 220. For example, a ratio of height (H) to diameter (D) in the dome pattern 221 may be larger than 1, and may be the same as or smaller than 2, but not limited to these ranges.

Also, the optical-path adjustment film 220 according to another embodiment of the present disclosure includes the cover layer 225 so that the flattened upper surface of the cover layer 225 enables to enhance an adhesive strength to a polarizing plate or cover glass provided on the cover layer 225, and the lower surface of the cover layer 225 for covering and fixing the plurality of dome patterns 221 enables to prevent the dome pattern 221 from being deformed by the polarizing plate and/or cover glass disposed on the cover layer 225.

In this case, if the diameter (D) of the dome pattern 221 is larger than the height (H) of the dome pattern 221, it is difficult to improve picture quality. According to another embodiment of the present disclosure, when the height (H) of the dome pattern 221 is larger than the diameter (D) of the dome pattern 221, the upper surface of the optical-path adjustment film 220 is flattened so that it is possible to improve picture quality.

Meanwhile, the plurality of dome patterns 221 included in the optical-path adjustment film 220 may be arranged in each sub pixel 211.

As shown in FIG. 22B, light is not emitted through the non-opening area 211b of the sub pixel 211, and light emitted from the opening area 211a is refracted while passing through the optical-path adjustment film 220, and is extended.

In this case, an air layer whose refractive index is smaller than the second refractive index may be provided on the cover layer 225 of the optical-path adjustment film 220.

That is, when light which is emitted to the invisible outside in the opening area 211a of the sub pixel 211 passes through the optical-path adjustment film 220, the light is refracted to a vertical direction due to the refractive index difference between the dome pattern 221/cover layer 225 and the air layer, whereby the light is emitted to the area corresponding to the non-opening area 211b as well as the area corresponding to the opening area 211a.

Accordingly, the output range of the sub pixel 211 may extend to the area corresponding to the non-opening area 211b.

Furthermore, when the light emitted from the opening area 211a passes through the optical-path adjustment film 220, its output range extends more by the diffraction.

Thus, if the light emitted from the sub pixel 211 passes through the optical-path adjustment film 220, the light is adjusted in such a way that its optical path advances toward the area corresponding to the opening area 211a of the sub pixel 211, and also advances toward the area corresponding to the non-opening area 211b of the sub pixel 211, whereby it enables to emit the visible light. As a result, it is possible to realize a clear image on the display device and to prevent the non-opening areas 211b of the sub pixels 211 from being connected with each other and being seen as a lattice pattern by a user.

As described above, in case of the display device according to another embodiment of the present disclosure (See '100' of FIG. 19), the optical-path adjustment film 220 including the plurality of dome patterns 221 and the cover layer 225 is provided on the display panel (See '110' of FIG. 2) so that the light emitted from the opening area 211a of each sub pixel 211 extends to the area corresponding to the non-opening area 211b.

In case of virtual reality (VR) device in which a user's eye is very close to a screen, it is possible to overcome problems such as lattice pattern and image blur.

Hereinafter, a detailed description for the same parts of the entire structure will be omitted since it is redundant.

Figure 23A:
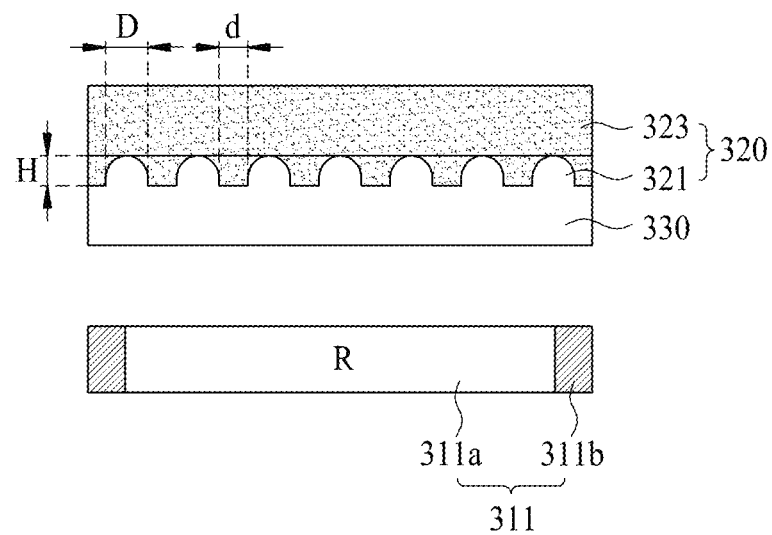
FIG. 23A is a cross sectional view illustrating an optical-path adjustment film and an optical adhesive film arranged in a sub pixel of a display device according to another embodiment of the present disclosure.
Figure 23B:
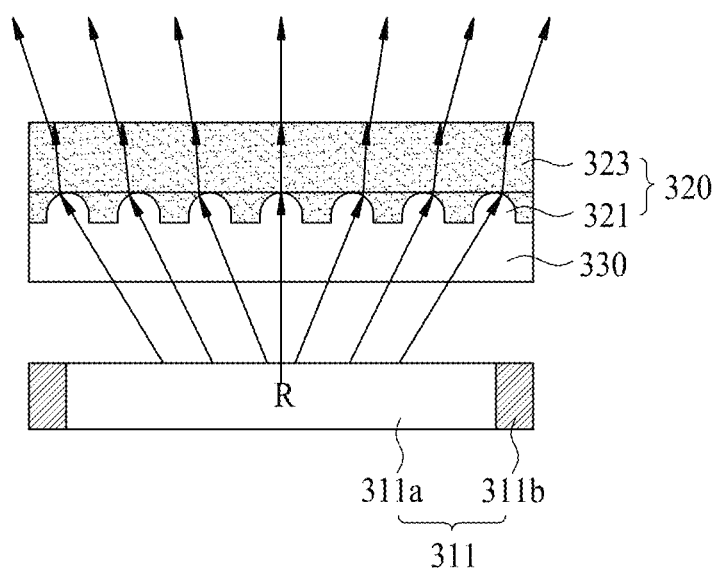
FIG. 23B illustrates an optical path in the display device provided with the optical-path adjustment film and the optical adhesive film according to another embodiment of the present disclosure.

FIG. 23A is a cross sectional view illustrating an optical-path adjustment film and an optical adhesive film arranged in a sub pixel of a display device according to another embodiment of the present disclosure. FIG. 23B illustrates an optical path in the display device provided with the optical-path adjustment film and the optical adhesive film according to another embodiment of the present disclosure.

As shown in FIG. 23A, there are one sub pixel 311 including an opening area 311a and a non-opening area 311b, an optical adhesive film 330 on one sub pixel 311, and an optical-path adjustment film 320 on the optical adhesive film 330.

The optical-path adjustment film 320 according to another embodiment of the present disclosure may include a base film 323, and a plurality of intaglio dome patterns 321 in a lower surface of the base film 323. That is, the optical-path adjustment film 320 may be provided with the flattened base film 323, and the plurality of intaglio dome patterns 321 formed in the lower surface of the base film 323 being adjacent to the display panel (See '110' of FIG. 17).

The optical adhesive film 330 may be provided to cover the plurality of dome patterns 321 in the lower surface of the optical-path adjustment film 320. That is, an upper surface of the optical adhesive film 330 being in contact with the optical-path adjustment film 320 may cover the plurality of intaglio dome patterns 321 of the optical-path adjustment film 320, and a lower surface of the optical adhesive film 330 may be flattened.

At this time, a refractive index of the optical adhesive film 330 may be higher than a refractive index of the optical-path adjustment film 320.

The optical-path adjustment film 320 may be formed of resin, for example, polyethylene terephthalate (PET), polycarbonate (PC), or acryl-based material, but not limited to these materials.

The optical adhesive film (optically clear adhesive) 330 may be formed of resin, but not limited to this type.

In order to prevent light emitted from the sub pixel 311 from being visible in the vacant space between each of the plurality of intaglio dome patterns 321 by the color dispersion, a diameter (D) in each of the intaglio dome patterns 321 included in the optical-path adjustment film 320 may be larger than a distance (d) between each of the plurality of intaglio dome patterns 321. For example, the diameter (D) in each of the dome patterns 321 may be within a range of 1 μm to 20 μm, and the distance (d) between each of the dome patterns 321 may be 5 μm or less than 5 μm, but not limited to these ranges.

The optical adhesive film 330 whose refractive index is greater than that of the optical-path adjustment film 320 is provided to cover the plurality of intaglio dome patterns 321 included in the optical-path adjustment film 320. Thus, in order to adjust the optical path, a height (H) of the dome pattern 321 has to be greater than that of the aforementioned embodiment.

In order to realize a clear image on the display device (See '100' of FIG. 19) and to prevent the lattice pattern from being seen by a user, the height (H) of the intaglio dome pattern 321 of the optical-path adjustment film 320 is larger than the diameter (D) of the intaglio dome pattern 321 of the optical-path adjustment film 320. For example, a ratio of height (H) to diameter (D) in the dome pattern 321 may be larger than 1, and may be the same as or smaller than 2, but not limited to these ranges.

Also, the optical adhesive film 330 according to another embodiment of the present disclosure is provided in such a way that the flattened upper surface of the optical adhesive film 330 enables to enhance an adhesive strength to a polarizing plate or cover glass provided on the optical adhesive film 330, and the lower surface of the optical adhesive film 330 for covering and fixing the plurality of intaglio dome patterns 321 in the lower side of the optical-path adjustment film 320 enables to prevent the intaglio dome pattern 321 from being deformed.

In this case, if the diameter (D) of the dome pattern 321 is larger than the height (H) of the dome pattern 321, it is difficult to improve picture quality. According to another embodiment of the present disclosure, when the height (H) of the dome pattern 321 is larger than the diameter (D) of the dome pattern 321, the upper surface of the optical-path adjustment film 320 is flattened so that it is possible to improve picture quality.

Meanwhile, the plurality of intaglio dome patterns 321 included in the optical-path adjustment film 320 may be arranged in each sub pixel 311.

As shown in FIG. 23B, light is not emitted through the non-opening area 311b of the sub pixel 311, and light emitted from the opening area 311a is refracted while passing through the optical-path adjustment film 320, and is extended.

In this case, an air layer whose refractive index is smaller than that of the optical-path adjustment film 320 may be provided on the optical-path adjustment film 320.

That is, when light which is emitted to the invisible outside in the opening area 311a of the sub pixel 311 passes through the optical-path adjustment film 320 and the optical adhesive film 330, the light is refracted to a vertical direction due to the refractive index difference between the optical-path adjustment film 320/optical adhesive film 330 and the air layer, whereby the light is emitted to the area corresponding to the non-opening area 311b as well as the area corresponding to the opening area 311a.

Accordingly, the output range of the sub pixel 311 may extend to the area corresponding to the non-opening area 311b.

Furthermore, when the light emitted from the opening area 311a passes through the optical-path adjustment film 320 and the optical adhesive film 330, its output range extends more by the diffraction.

Thus, if the light emitted from the sub pixel 311 passes through the optical-path adjustment film 320 and the optical adhesive film 330, the light is adjusted in such a way that its optical path advances toward the area corresponding to the opening area 311a of the sub pixel 311, and also advances toward the area corresponding to the non-opening area 311b of the sub pixel 311, whereby it enables to emit the visible light. As a result, it is possible to realize a clear image on the display device and to prevent the non-opening areas 311b of the sub pixel 311 from being connected with each other and being seen as a lattice pattern by a user.

As described above, the display device according to another embodiment of the present disclosure (See '100' of FIG. 19) is provided with the optical-path adjustment film 320 including the plurality of intaglio dome patterns 321 on the display panel (See '110' of FIG. 17), and the optical adhesive film 320 disposed between the display panel (See '110' of FIG. 17) and the optical-path adjustment film 320 so as to cover the plurality of intaglio dome patterns 321 of the optical-path adjustment film 320 so that the light emitted from the opening area 311a of each sub pixel 311 extends to the area corresponding to the non-opening area 311b.

In case of virtual reality (VR) device in which a user's eye is very close to a screen, it is possible to overcome problems such as lattice pattern and image blur.

Figure 24:
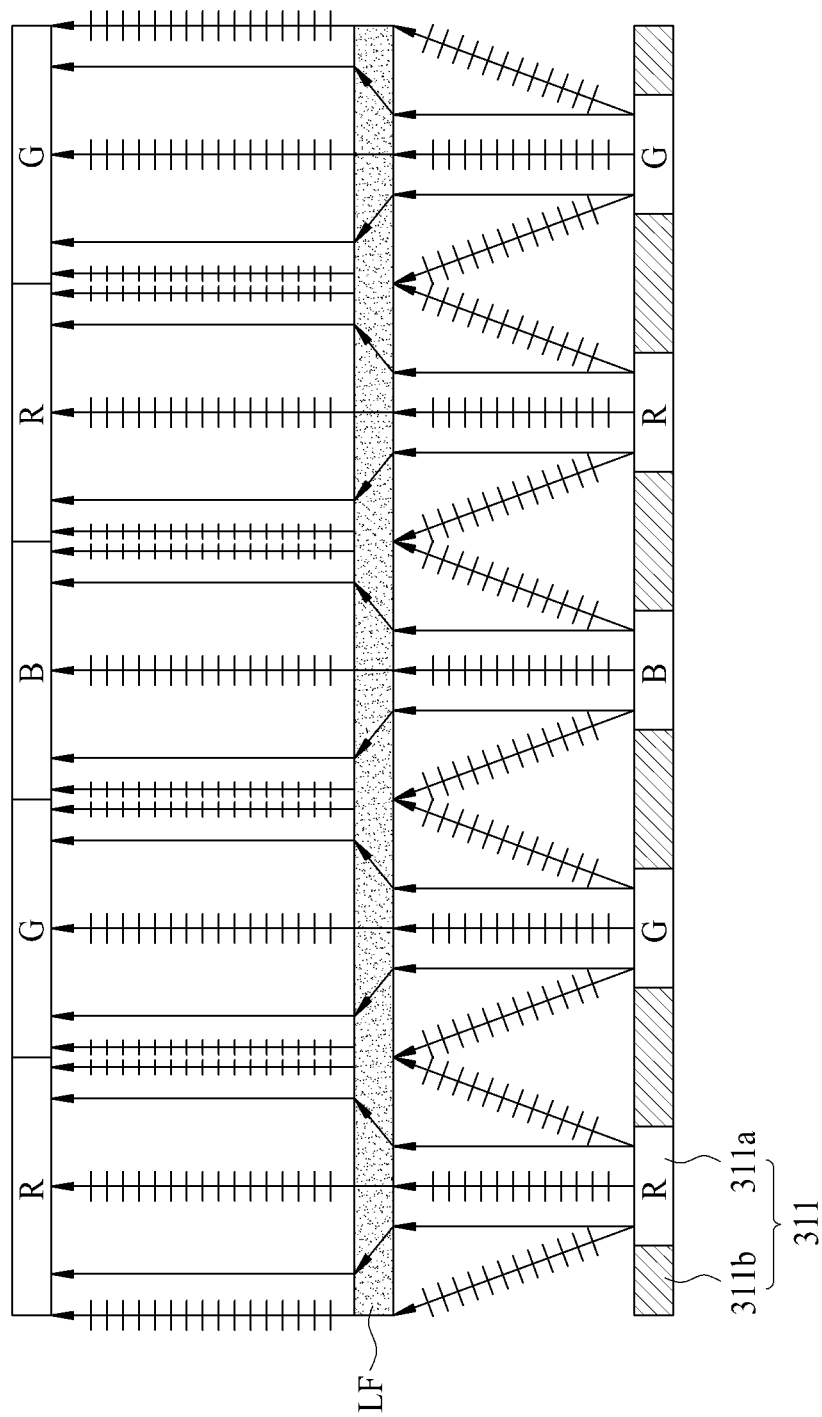
FIG. 24 illustrates that a sub pixel is extended to an area corresponding to a non-opening area.

FIG. 24 illustrates that the sub pixel is extended to the area corresponding to the non-opening area.

As shown in FIG. 24, the sub pixel 311 is divided into the opening area 311 in which the light is emitted, and the non-opening area 311b in which the light is not emitted. The light emitted from the opening area 311a is refracted and diffracted while being passed through the optical film (LF), whereby the light is extended to the area corresponding to the non-opening area 311b.

In this case, the optical film (LF) may be the aforementioned optical-path adjustment film (See '120' of FIG. 21, and '220' of FIG. 22B), or the aforementioned optical adhesive film (See '330' of FIG. 23B) and optical-path adjustment film (See '320' of FIG. 23B).

Accordingly, the display device (See '100' of FIG. 19) according to the embodiment of the present disclosure enables to realize a clear image and to prevent the non-opening areas 311b of the sub pixels 311 from being connected with each other and being seen as a lattice pattern by a user.

Figure 25A:
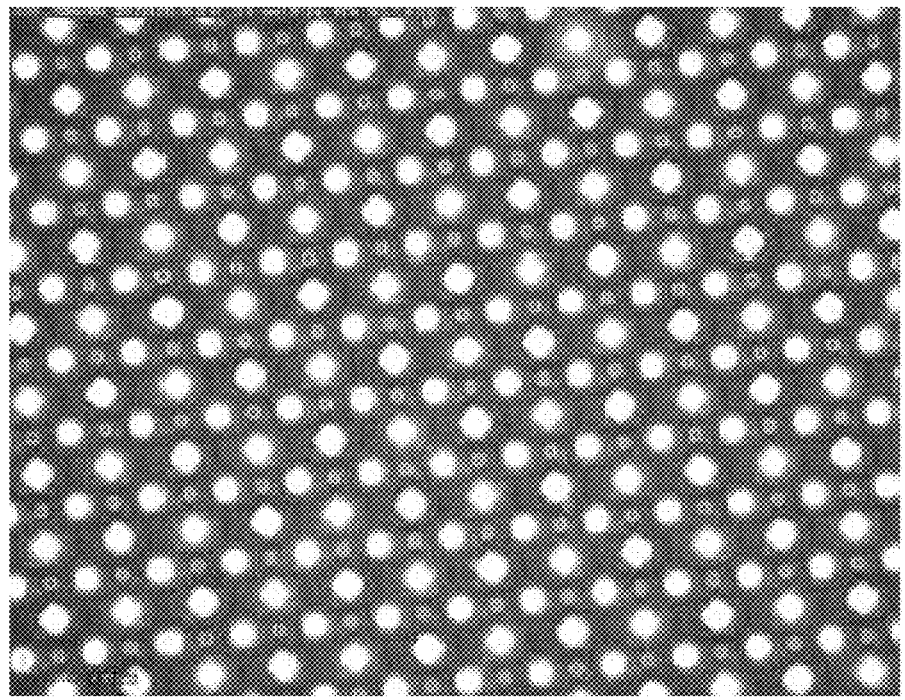
FIG. 25A is a photograph showing a lattice pattern caused by the non-opening area of the sub pixel.
Figure 25B:
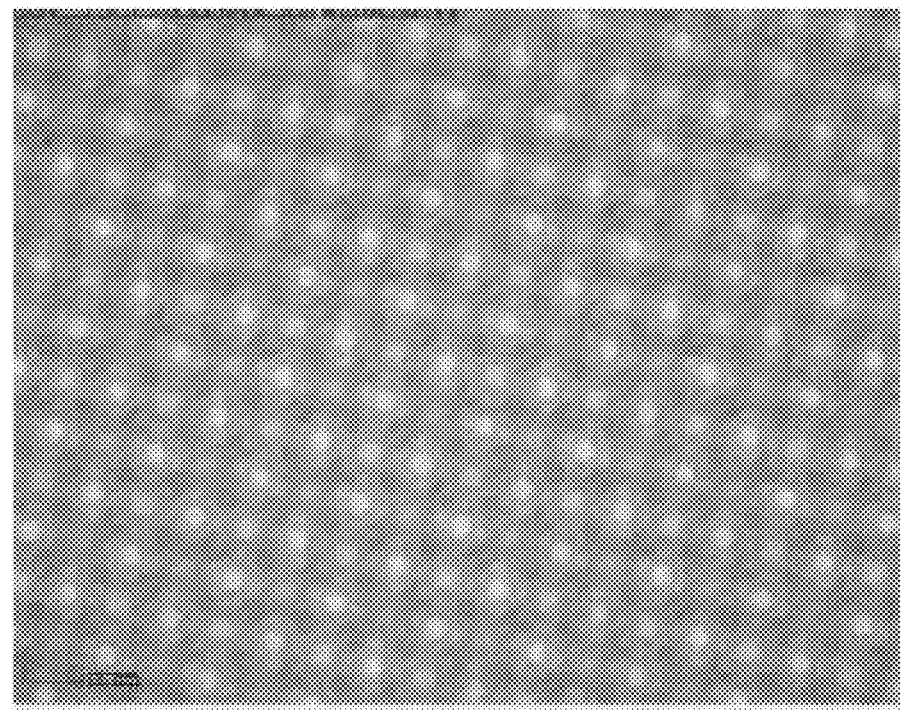
FIG. 25B is a photograph with a reduced lattice pattern according to another embodiment of the present disclosure.

FIG. 25A is a photograph showing the lattice pattern caused by the non-opening area of the sub pixel, and FIG. 25B is a photograph with the reduced lattice pattern according to the embodiment shown in FIG. 19.

As shown in FIG. 25A, in case of the display device without the optical-path adjustment film, the non-opening areas (See 'A2' of FIG. 16) in which the light is not emitted are connected with each other, whereby the lattice pattern is shown by a user. Meanwhile, in case of the display device (See '100' of FIG. 19) according to the embodiment shown in FIG. 19, it is possible to reduce the lattice pattern and to realize the clear image, as shown in FIG. 25B.

Figure 26A:
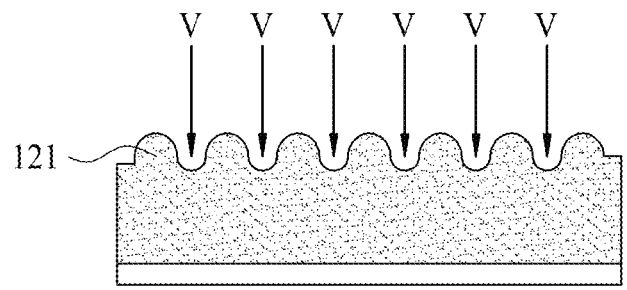
FIGS. 26A to 26C illustrate the modified embodiments of a dome pattern according to the present disclosure.
Figure 26B:
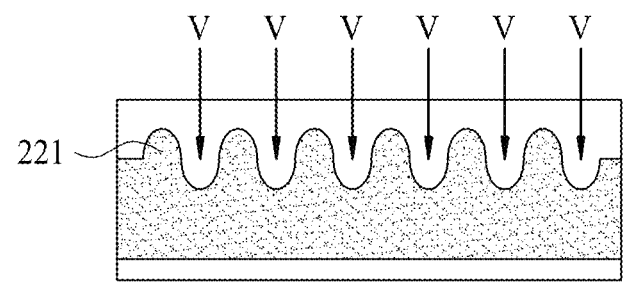
Figure 26C:
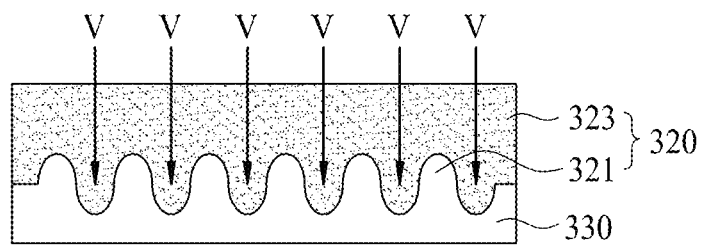

FIGS. 26A to 26C illustrate the modified embodiments of the dome pattern according to the present disclosure.

As shown in the drawings, the plurality of dome patterns 121, 221, and 321 may be provided at fixed intervals.

In this case, a V-shaped groove (valley) may be formed in the space between each of the dome patterns 121, 221, and 321. That is, the space between each of the dome patterns 121, 221, and 321 is not flattened, and the V-shaped groove may be formed in the space between each of the dome patterns 121, 221, and 321.

In case of the aforementioned embodiment with the intaglio dome pattern, the V-shaped groove is formed in the optical adhesive film 330, and the optical-path adjustment film 320 is provided to fill the V-shaped groove formed in the optical adhesive film 330.

If the V-shaped groove is formed in the space between each of the dome patterns 121, 221, and 321, it is possible to improve the pattern fill factor, and thus to improve extendability of light to the area corresponding to the non-opening area (See '311b' of FIG. 24), which will be described later in detail.

Figure 27:
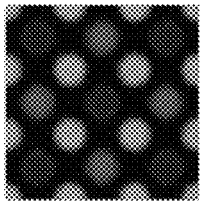
FIG. 27 is a photograph showing the change of lattice pattern in accordance with a height of a dome pattern according to the embodiment of the present disclosure.
Figure 27:
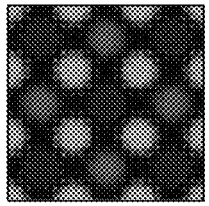
Figure 27:
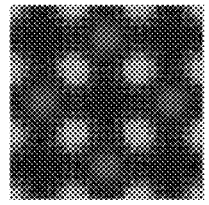
Figure 27:
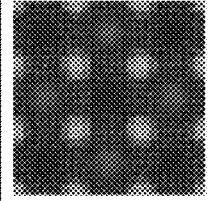
Figure 27:
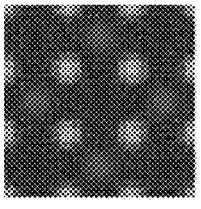
Figure 27:
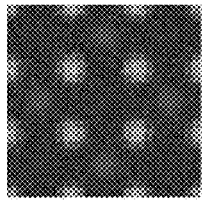
Figure 27:
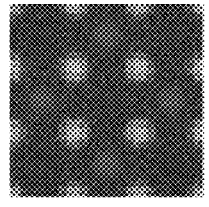
Figure 27:
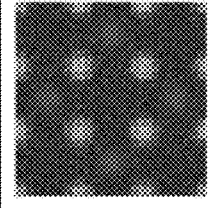

FIG. 27 is a photograph showing the change of lattice pattern in accordance with the height of the dome pattern according to the embodiment of the present disclosure.

At this time, when the diameter (See 'D' of FIG. 17) of the dome pattern (See '121' of FIG. 17) of the optical-path adjustment film (See '120' of FIG. 17) is 4 μm, and the pitch of the dome pattern (See '121' of FIG. 17) is 5 μm, it shows the change of lattice pattern in accordance with the change of the height (See 'H' of FIG. 17).

As shown in the drawings, if the ratio of height (H) to diameter (D) in the dome pattern is within a range of 0.1 to 0.5, it is possible to realize the clear image on the display device (See '100' of FIG. 19) and to prevent the lattice pattern from being seen by a user.

That is, when the diameter (D) of the dome pattern (See '121' of FIG. 17) is 4 μm, and the height (H) of the dome pattern (See '121' of FIG. 17) is within a range of 0.4 μm to 2 μm, it is possible to realize the clear image and to prevent the lattice pattern from being seen by a user.

The optical-path adjustment film (See '220' of FIG. 22B) according to the embodiment of the present disclosure is provided with the base film (See '223' of FIG. 22B), the plurality of dome patterns (See '221' of FIG. 22B), and the cover layer 225 on the plurality of dome patterns (See '221' of FIG. 22B), wherein the refractive index of the cover layer 225 is lower than that in each of the base film (See '223' of FIG. 22B) and the plurality of dome patterns (See '221' of FIG. 22B). Thus, in order to adjust the optical path, the height (See 'H' of FIG. 7A) of the dome pattern (See '221' of FIG. 7B) has to be relatively greater than that of the aforementioned embodiment. That is, if the ratio of height (H) to diameter (D) in the dome pattern is within a range of 0.5 to 2, it is possible to realize the clear image on the display device and to prevent the lattice pattern from being seen by a user.

According to the embodiment of the present disclosure, the optical adhesive film (See '330' of FIG. 23B) is provided to cover the plurality of intaglio dome patterns (See '321' of FIG. 23B) of the optical-path adjustment film (See '320' of FIG. 23B), wherein the refractive index of the optical adhesive film is larger than that of the optical-path adjustment film. Thus, in order to adjust the optical path, the height (See 'H' of FIG. 23A) of the dome pattern (See '321' of FIG. 8B) has to be relatively greater than that of the aforementioned embodiment. That is, if the ratio of height (H) to diameter (D) in the dome pattern is within a range of 0.5 to 2, it is possible to realize the clear image on the display device and to prevent the lattice pattern from being seen by a user.

Figure 28A:
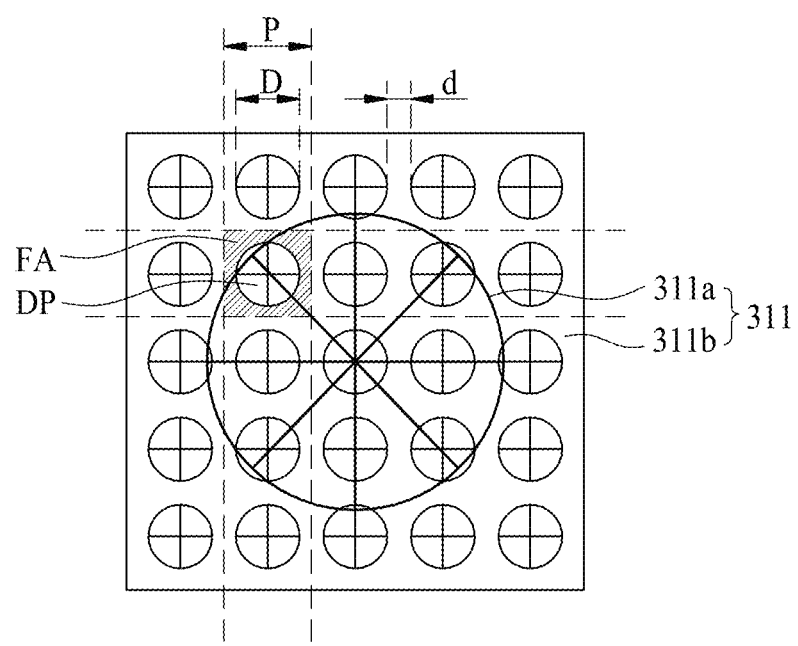
FIG. 28A illustrates a pattern fill factor.

FIG. 28A illustrates the pattern fill factor, and FIG. 28B is a photograph showing the change of lattice pattern in accordance with the change of pattern fill factor.

As shown in FIG. 28A, the dome pattern (DP) formed in the optical-path adjustment film (See '120' of FIG. 17, '220' of FIG. 22B, and '320' of FIG. 23B) according to the embodiments of the present disclosure may be provided in one sub pixel 311 including the opening area 311a and the non-opening area 311b.

At this time, the area occupied by the dome pattern (DP) in the first area (FA) in consideration of the diameter (D) of the dome pattern (DP) and the distance (d) between each of the dome patterns (DP) may be defined as the pattern fill factor (DP/FA×100).

Accordingly, the pattern fill factor may be changed in accordance with the diameter (D) of the dome pattern (DP), and the pitch (P) of the dome pattern (DP).

FIG. 28B illustrates the change of lattice pattern in accordance with the change of pitch of the dome pattern (DP) when the diameter (D) of the dome pattern (DP) is 4 μm, and the ratio of height (H) to diameter (D) is 0.1.

That is, as the diameter (D) of the dome pattern (DP) is fixed, the pattern fill factor may be changed in accordance with the change of the pitch (P) in the dome pattern (DP).

As shown in the drawings, when the pitch (P) of the dome pattern (DP) is 4 μm, the pattern fill factor is about 80%. In this case, it is possible to realize the clear image on the display device (See '100' of FIG. 19) and to prevent the lattice pattern from being seen by a user.

Also, when the pitch (P) of the dome pattern (DP) is 6 μm, the pattern fill factor is about 35%. In this case, it is possible to realize the clear image on the display device (See '100' of FIG. 19) and to prevent the lattice pattern from being seen by a user.

When the pitch (P) of the dome pattern (DP) is 8 μm, the pattern fill factor is about 20%. In this case, the lattice pattern is displayed on the display device (See '100' of FIG. 19), and is seen by a user.

That is, when the pattern fill factor is within a range of about 35% to 80%, it is possible to realize the clear image on the display device and to prevent the lattice pattern from being seen by a user.

Meanwhile, according as the pattern fill factor is increased, extendability of the light emitted from the sub pixel (See '311' of FIG. 9) is increased. However, when the dome pattern (DP) is formed in the optical-path adjustment film (See '120' of FIG. 17, '220' of FIG. 22B, and '320' of FIG. 23B), it may cause problems related with deterioration on releasing property of the optical-path adjustment film (See '120' of FIG. 17, '220' of FIG. 22B, and '320' of FIG. 23B) and stamper. In this case, it is difficult to realize the pattern fill factor of 80% or more than 80%.

Referring to FIGS. 26A to 26C illustrating the modified embodiments of the present disclosure, in case of the structure where the space between each of the dome patterns (See '121' of FIG. 26A, '221' of FIG. 26B, and '321' of FIG. 26C) is not flattened, and the V-shaped groove is formed in the space between each of the dome patterns (See '121' of FIG. 26A, '221' of FIG. 26B, and '321' of FIG. 26C), there is no problem related with deterioration on releasing property of the optical-path adjustment film (See '120' of FIG. 17, '220' of FIG. 22B, and '320' of FIG. 23B) and stamper and the pattern fill factor can be increased to 100%. Accordingly, it is possible to improve extendability of the light emitted from the sub pixel 311.

Figure 29A:
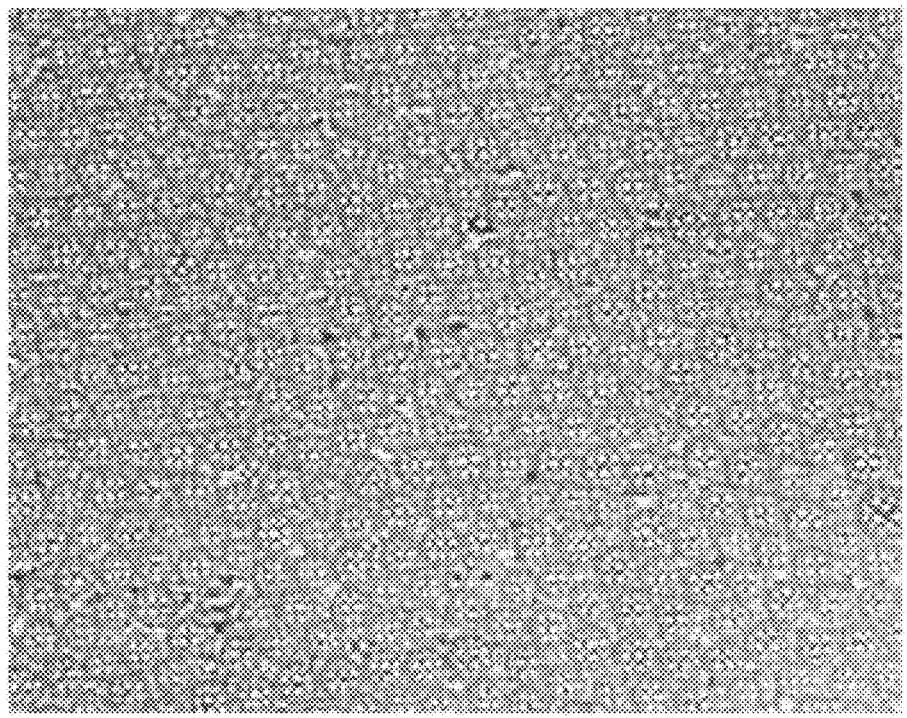
FIGS. 29A and 29B are photographs showing color dispersion in accordance with a diameter of a dome pattern according to the embodiment of the present disclosure.
Figure 29B:
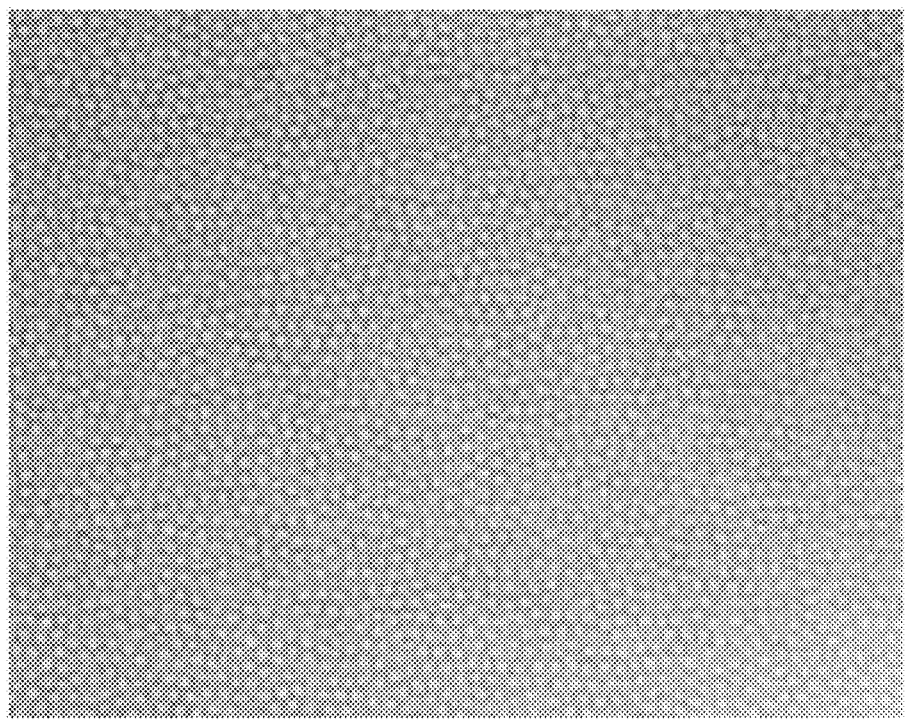

FIGS. 29A and 29B are photographs showing the color dispersion in accordance with the diameter of the dome pattern according to the embodiment of the present disclosure.

As shown in FIG. 29A, the light emitted from the sub pixel (See '311' of FIG. 24) is emitted through the vacant space between each of the dome patterns (See' DP of FIG. 28A), and is visible as the color dispersion via the vacant space.

In order to minimize the color dispersion by the vacant space between each of the dome patterns (See 'DP' of FIG. 28A), the diameter (See 'D' of FIG. 28A) of the dome pattern (See 'DP' of FIG. 28A) is 20 μm or less than 20 μm, preferably.

When the diameter (See 'D' of FIG. 28A) of the dome pattern (See 'DP' of FIG. 28A) is 20 μm or less than 20 μm, as shown in FIG. 29B, it is possible to prevent the color dispersion from being visible.

The diameter (See 'D' of FIG. 28A) of the dome pattern (See 'DP' of FIG. 28A), which corresponds to 20 μm or less than 20 μm, may be changed based on the size of the sub pixel (See '311' of FIG. 24), but not limited to this range.

Figure 30:
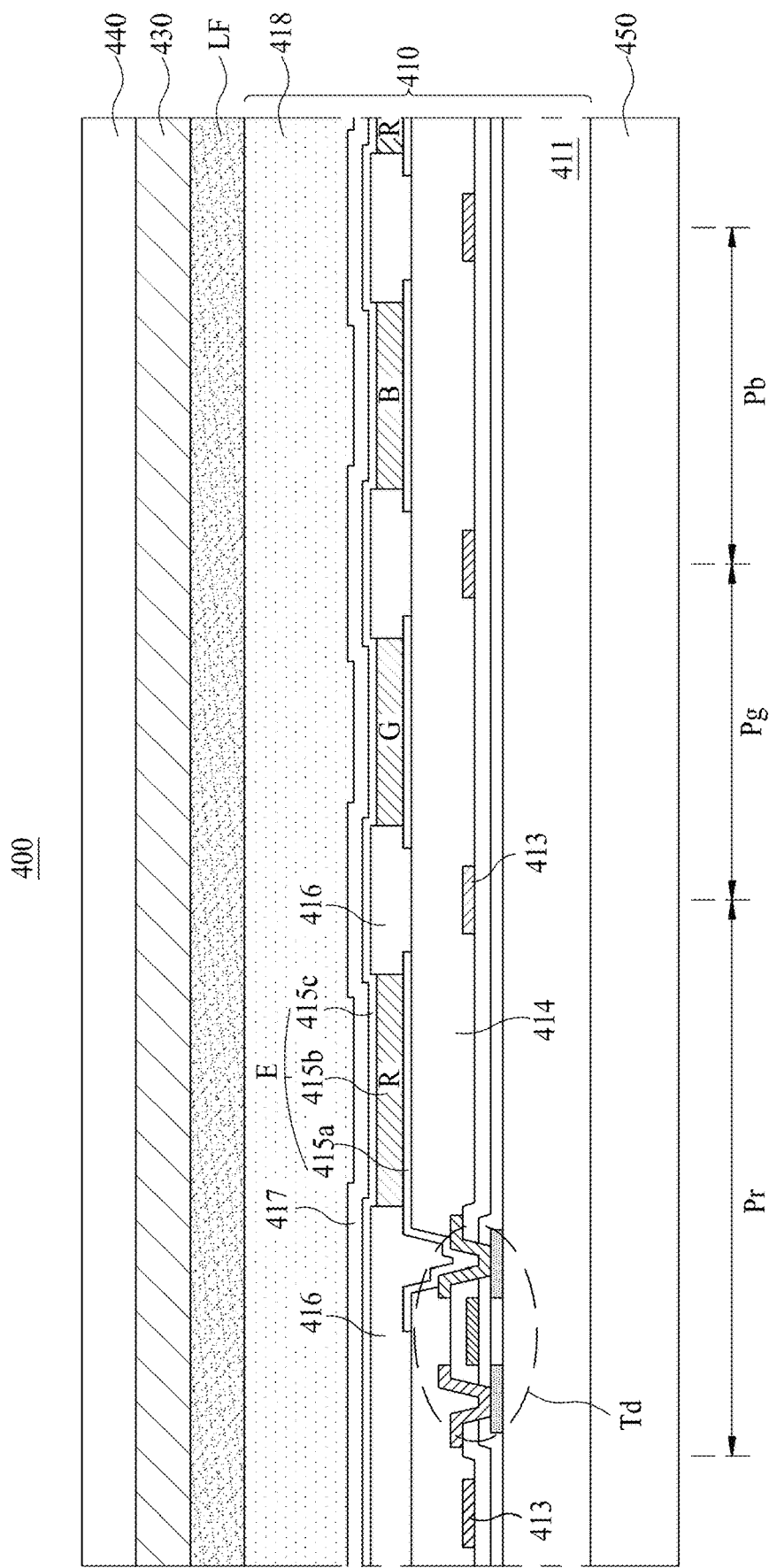
FIG. 30 illustrates one example of the display device according to the embodiment of the present disclosure, which includes an organic light emitting diode panel.

FIG. 30 illustrates one example of the display device according to the embodiment of the present disclosure, which includes an organic light emitting diode panel.

As shown in FIG. 30, there are a heat-radiation film 450, an organic light emitting diode panel 410 disposed on the heat-radiation film 450, an optical film (LF) on the organic light emitting diode panel 410, wherein the optical film (LF) corresponds to the aforementioned optical-path adjustment film (See '120' of FIG. 6, '220' of FIG. 7B, and '330 and 320' of FIG. 8B), and a cover glass 440 provided on the optical film (LF) so as to protect a polarizing plate 430 and the organic light emitting diode panel 410.

The heat-radiation film 450 is provided to prevent a lifespan of the display device from being shortened by heat generated for driving the organic light emitting diode panel 410, and deterioration of a driving thin film transistor (Td). The heat-radiation film 450 may be formed in an uneven-shaped pattern so as to increase a contact surface.

The organic light emitting diode panel 410 may include a first substrate 411 defined with a plurality of sub pixel areas (Pr, Pg, Pb), a light emitting diode (E) formed in each sub pixel area (Pr, Pg, Pb), and an encapsulation layer 418 for covering the light emitting diode (D).

The driving thin film transistor (Td) may be formed in the sub pixel area (Pr, Pg, Pb) inside the first substrate 411, and a first protection layer 414 may be formed on the driving thin film transistor (Td).

The driving thin film transistor (Td) may include a semiconductor layer, a gate electrode, a source electrode, and a drain electrode. An insulating interlayer is provided on the gate electrode, and a data line 413 is provided on the insulating interlayer.

A first electrode 415a is formed in each sub pixel area (Pr, Pg, Pb) on the first protection layer 414, wherein the first electrode 415a is connected with the driving thin film transistor (Td). An emission layer 415b including an emission pattern for emitting red (R), green (G) or blue (B) light is formed in each sub pixel area (Pr, Pg, Pb) on the first electrode 415a, and a second electrode 415c is formed on an entire upper surface of the emission layer 415b.

Then, a bank layer 416 is formed on the first electrode 415a, wherein the bank layer 416 divides the emission pattern for emitting red (R), green (G) or blue (B) light by each sub pixel area (Pr, Pg, Pb).

In this case, the first electrode 415a, the emission layer 415b and the second electrode 415c may constitute the light emitting diode (D).

A second protection layer 417 is formed on the second electrode 415c, and an encapsulation layer 418 is formed on the second protection layer 417.

The encapsulation layer 418 may be formed by depositing organic and inorganic layers on the second protection layer 417 or by a face seal on the second protection layer 417.

The first substrate 411, which is referred as a lower substrate, TFT substrate or backplane, may be formed of a glass or plastic material.

The second protection layer 417, which is formed on the light emitting diode (E), prevents permeation of moisture or foreign matters from the external, and the encapsulation layer 418, which is formed on the second protection layer 417, prevents permeation of moisture or foreign matters from the external, and also absorbs an external shock.

On explanation of the present disclosure, the aforementioned organic light emitting diode panel structure shows only one example, but not limited to this structure.

According as the aforementioned optical film (LF) is attached to the upper surface of the organic light emitting diode panel 410, the optical panel of the light emitted from the organic light emitting diode panel 410 extends to the non-opening area (See '311b' of FIG. 9) so that it is possible to display a clear image and to reduce a lattice pattern.

Also, the optical film (LF) protects the encapsulated upper surface of the organic light emitting diode panel 410, to thereby improve reliability of the organic light emitting diode panel 410.

Also, the polarizing plate 430 is provided to prevent efficiency of the display device 400 from being deteriorated by a mutual interference between light emitted from the organic light emitting diode panel 410 and ambient light provided from the external and reflected on an internal reflecting plate. Herein, according as an absorbing axis of a polarizer and an optical axis (absorbing axis) of a phase difference compensation film are inclined in the polarizing plate 430, a waveform of the ambient light reflected on the internal reflecting plate is rotated, whereby the polarizing plate 430 functions as a reflection preventing filter.

On explanation of the present disclosure, the optical film (LF) is disposed between the organic light emitting diode panel 410 and the polarizing plate 430. However, it shows only one example, but not limited to this structure. The optical film (LF) may be disposed on the polarizing plate 430.

If the display device 400 according to the present disclosure is applied to a virtual reality (VR) device, it is possible to omit the cover glass 440 and the polarizing plate 430 due to a structure of the VR device.

FIG. 31 illustrates one example of the display device according to the embodiment of the present disclosure, which includes a liquid crystal panel.

As shown in FIG. 31, a liquid crystal display device 500 may include a liquid crystal panel 510, and an optical film (LF) on the liquid crystal panel 510, wherein the optical film (LF) may be the aforementioned optical-path adjustment film (See '120' of FIG. 6, '220' of FIG. 7B, and '320' and '330' of FIG. 8B).

The liquid crystal panel 510 may include first and second substrates 511 and 512 confronting each other, and a liquid crystal layer 579 interposed between the first and second substrates 511 and 512.

On the first substrate 511, there are a plurality of gate lines (not shown) provided at fixed intervals, wherein each gate line extends in one direction, and a common line (not shown) provided at a predetermined interval from each gate line (not shown) and arranged while being parallel to each gate line (not shown).

A thin film transistor (Tr) functioning as a switching device may be provided in a switching area (TrA), wherein the thin film transistor (Tr) may be formed by sequentially depositing a gate electrode 513, a gate insulating film 514, a semiconductor layer 515, and source and drain electrodes 516 and 157 separated from each other.

Also, a data line 580 for defining a pixel region (Pa) is provided on the gate insulating film 514, wherein the data line 580 and the gate line (not show) cross each other. In this case, the source electrode 516 may be connected with the data line 580.

Then, first and second protection layers 518 and 519 are provided on the thin film transistor (Tr) and the data line 580, wherein the first and second protection layers 518 and 519 include a common line contact hole (not shown) and a drain contact hole 519 for respectively exposing the common line (not shown) and the drain electrode 517 of the thin film transistor (Tr). At this time, the first protection layer 518 is formed of an inorganic insulating material, and the second protection layer 519 having a flattened surface is formed of an organic insulating material.

Thereafter, a plurality of common electrodes 571 and a plurality of pixel electrodes 570 may be provided on the second protection layer 519. The plurality of common electrodes 571 may have a bar shape connected with the common line (not shown) via the common line contact hole (not shown) in each pixel region (P), wherein the plurality of common electrodes 571 may be formed of a transparent conductive material, for example, indium-tin-oxide (ITO) or indium-zinc-oxide (IZO). The plurality of pixel electrodes 570 may have a bar shape being in contact with the drain electrode 517 via the drain contact hole 519a. The common electrodes 571 and the pixel electrodes 570 may be provided at fixed intervals, and the common electrodes 571 alternate with the pixel electrodes 570.

The second substrate 512 confronting the first substrate 511 may be provided with a black matrix 572, and a color filter layer 573. The black matrix 572 is provided above the thin film transistor (Tr) and the boundaries of each sub pixel area of the first substrate 511. The color filter layer 573 is overlapped with the black matrix 572, and the color filter layer 573 is provided in the area surrounded by the black matrix 572, wherein the color filter layer 573 includes red, green, and blue color filter patterns (R, G, B) sequentially provided in each sub pixel area.

Then, an overcoat layer 578 having a flattened surface may be provided to protect the color filter layer 573.

Also, first and second polarizing plates 581 and 582 are respectively provided on outer surfaces of the first and second substrates 511 and 512, and the first and second polarizing plates 581 and 582 transmit light with polarizing components which are identical to transmission axes. Herein, a light transmittance level is determined based on the arrangement of transmission axes of the first and second polarizing plates 581 and 582, and alignment properties of liquid crystal molecules.

In this case, the transmission axis of the first polarizing plate 581 may be vertical to the transmission axis of the second polarizing plate 582.

According as the aforementioned optical film (LF) may be attached to the upper surface of the second polarizing plate (upper polarizing plate) 582 disposed on the outer surface of the second substrate (color filter substrate) 512, or the aforementioned optical film (LF) may be attached between the upper polarizing plate 582 disposed on the outer surface of the color filter substrate 512 and the color filter substrate 512, the path of the light emitted from the liquid crystal panel 510 may extend to the area corresponding to the non-opening area (See '311b' of FIG. 9) so that it is possible to realize the display device 500 capable of displaying a clear image and reducing a lattice pattern.

On explanation of the present disclosure, the aforementioned liquid crystal panel structure only one example, but not limited to this structure.

On explanation of the present disclosure, it illustrates the pentile structure, which is only one example, but not limited to this structure.

According to one embodiment of the present disclosure, the optical-path adjustment film is provided on the upper surface of the display panel so that it is possible to adjust the amount of light passing through the upper surface of the display panel by each wavelength range, to thereby overcome the problem related with the bluish image.

According to another embodiment of the present disclosure, the optical-path adjustment film is disposed on the display panel so that the light emitted from the display panel extends to the area corresponding to the non-opening area, thereby realizing the clear image and reducing the lattice pattern.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
    a display panel having a plurality of openings; and
    an optical-path adjustment film on the display panel,
    wherein the optical-path adjustment film includes a plurality of dome patterns and a cover layer on the plurality of dome patterns,
    wherein the plurality of openings includes a first opening,
    wherein the plurality of dome patterns includes a first dome pattern and a second dome pattern, the first dome pattern aligned with the first opening in a first direction, the second dome pattern aligned with the first opening in the first direction,
    wherein a refractive index of the plurality of dome patterns is different from a refractive index of the cover layer;
    wherein the optical-path adjustment film further includes a base layer under the plurality of dome patterns, and the plurality of dome patterns are provided in a convex pattern on the base layer, and wherein a groove extends into the base layer from an upper surface of the base layer in a space between each of the dome patterns in the plurality of dome patterns, the groove including a first groove and a second groove, the first groove overlapped with the first opening in the first direction, the second groove overlapped with the first opening in the first direction, and
    wherein the plurality of dome patterns is formed from the base layer with the same material from the base layer, the base layer having a substantially planar surface opposite the upper surface of the base layer.

2. The display device according to claim 1,
    wherein the cover layer includes a first cover layer on the plurality of dome patterns, and a second cover layer on the first cover layer,
    wherein the refractive index of the plurality of dome patterns is smaller than a refractive index of the first cover layer, and a refractive index of the second cover layer is smaller than the refractive index of the first cover layer; or the refractive index of the plurality of dome patterns is larger than the refractive index of the first cover layer, and the refractive index of the second cover layer is larger than the refractive index of the first cover layer.

3. The display device according to claim 1, wherein a surface of the plurality of dome patterns includes a flattened surface corresponding to a center of each of the dome patterns, and a curved surface corresponding to a peripheral area of each of the dome patterns.

4. The display device according to claim 1, wherein a refractive index difference between the plurality of dome patterns and the cover layer is within a range of 0.05 to 0.4.

5. The display device according to claim 1, wherein a ratio of a height to a diameter in each of the plurality of dome patterns is within a range of 0.05 to 2.

6. The display device according to claim 1, wherein a diameter in each of the plurality of dome patterns is within a range of 1 µm to 20 µm.

7. The display device according to claim 1, wherein the optical-path adjustment film is fixed onto the display panel by use of an adhesive layer.

8. The display device according to claim 1, wherein the optical-path adjustment film is directly fixed onto the display panel without using an adhesive layer.

9. The display device according to claim 1, wherein the plurality of dome patterns have the different diameters from each other.

10. The display device according to claim 1, wherein the plurality of dome patterns are arranged with different pitches.

11. The display device according to claim 1, further comprising a polarizing film on the display panel, and a cover film on the polarizing film,
    wherein the optical-path adjustment film is disposed in any one of spaces between the display panel and the polarizing film, between the polarizing film and the cover film, and on the cover film.

12. The display device according to claim 1, wherein the groove connects each of the dome patterns in the plurality of dome patterns that is adjacent to each other with a continuous curve surface in the space between each of the dome patterns in the plurality of dome patterns.

13. The display device according to claim 1, wherein the groove extends in a direction toward the display panel.

* * * * *